(12) United States Patent
Onishi et al.

(10) Patent No.: US 8,715,900 B2
(45) Date of Patent: May 6, 2014

(54) SELF-IMAGEABLE LAYER FORMING POLYMER AND COMPOSITIONS THEREOF

(75) Inventors: Osamu Onishi, Tokyo (JP); Haruo Ikeda, Tokyo (JP); Nobuo Tagashira, Tokyo (JP); Larry Rhodes, Silver Lake, OH (US); Pramod Kandanarachchi, Brecksville, OH (US)

(73) Assignees: Promerus, LLC, Brecksville, OH (US); Sumitomo Bakelite Co., Ltd., Tokyo (JP)

( * ) Notice: Subject to any disclaimer, the term of this patent is extended or adjusted under 35 U.S.C. 154(b) by 0 days.

(21) Appl. No.: 13/550,586

(22) Filed: Jul. 16, 2012

(65) Prior Publication Data
US 2013/0017488 A1    Jan. 17, 2013

Related U.S. Application Data

(60) Provisional application No. 61/507,685, filed on Jul. 14, 2011, provisional application No. 61/548,832, filed on Oct. 19, 2011.

(51) Int. Cl.
*G03F 7/22* (2006.01)
*G03F 7/039* (2006.01)

(52) U.S. Cl.
USPC .................. 430/192; 430/280.1; 430/326

(58) Field of Classification Search
None
See application file for complete search history.

(56) References Cited

U.S. PATENT DOCUMENTS

| | | | |
|---|---|---|---|
| 4,827,022 A | 5/1989 | Makowka et al. | |
| 5,212,043 A | 5/1993 | Yamamoto et al. | |
| 5,843,624 A | 12/1998 | Houlihan et al. | |
| 6,147,177 A * | 11/2000 | Jayaraman et al. | 526/281 |
| 7,417,264 B2 | 8/2008 | Fang et al. | |
| 7,524,594 B2 | 4/2009 | Amoroso et al. | |
| 7,566,598 B2 | 7/2009 | Wu et al. | |
| 2010/0053486 A1 | 3/2010 | Shim et al. | |
| 2010/0059745 A1 | 3/2010 | Yoon et al. | |
| 2012/0129101 A1 * | 5/2012 | Onishi et al. | 430/283.1 |

FOREIGN PATENT DOCUMENTS

| | | |
|---|---|---|
| EP | 0836119 A1 | 4/1998 |
| EP | 0989462 A1 | 3/2000 |
| WO | WO 2011/002516 A2 | 1/2011 |

OTHER PUBLICATIONS

Joo, et.al, "High Performance 193nm Photoresist Materials Based on ROMA polymers; sub-90nm Contact Hole Application with Resist Reflow", Advances in Resist Technology and Processing XXI, Proceedings of SPIE, vol. 5376, pp. 126-133, (2004).
Joo, et.al., "Ring Opened Maleic anhydride and Norbornene Copolymers(ROMA) have a good Character in Resist Flow Process for 193nm Resist Technology", Advances in Resist Technology and Processing XX, Proceedings of SPIE, vol. 5039, pp. 725-732, (2003).
Park, et.al., "New Approach for 193nm Resist Using Modified Cycloolefin Resin", Advances in Resist Technology and Processing XIX, Proceedings of SPIE, vol. 4690, pp. 120-126, (2002).
Yang, et.al., "Transparent Sol-Gel Hybrid Dielectric Materials Coatings for Low k Passivation Layer", IMID 2009 Digest, pp. 1453-1456.
Bhagiyalakshmi, et.al., "Effect of hydrophobic and hydrophilic properties of solid acid catalysts on the esterification of maleic anhydride with ethanol", Catalysis Communications, vol. 9, pp. 2007-2012, (2008).
Induri, et.al., "A kinetic approach to the esterification of maleic anhydride with methanol on H-Y zeolite", Journal of Industrial and Engineering Chemistry, vol. 16, pp. 467-473, (2010).
Bhagiyalakshmi, et.al., "Esterification of maleic anhydride with methanol over solid acid catalysts: a novel route for the production of heteroesters", Applied Catalysis A: General, vol. 267, pp. 77-86, (2004).
Xiao-yu, et.al., "Esterification of Maleic Anhydride with Butanol over Tin Tetrachloride Supported on Silica Aerogels Catalyst", Journal of Molecular Catalysis, vol. 26(1), pp. 39-45, (2012).
Wang, et.al, "Reaction Kinetics of Methanol and Maleic Anhydride", Advanced Materials Research, vols. 233-235, pp. 1623-1627, (2011).

* cited by examiner

*Primary Examiner* — Cynthia Hamilton
(74) *Attorney, Agent, or Firm* — Balaram Gupta; Michael W. Ferrell

(57) ABSTRACT

Copolymers and compositions thereof useful for forming self-imageable films encompassing such copolymers are disclosed. Such copolymers encompass norbornene-type repeating units and maleic anhydride-type repeating units where at least some of such and maleic anhydride-type repeating units have been ring-opened. The films formed from such copolymer compositions provide self imageable, low-k, thermally stable layers for use in microelectronic and optoelectronic devices.

12 Claims, 3 Drawing Sheets

SELF-IMAGEABLE LAYER FORMING POLYMER AND COMPOSITIONS THEREOF

CROSS-REFERENCE TO RELATED PATENT APPLICATION

The present patent application is entitled to and claims the benefit of priority, under 35 U.S.C. §119 of U.S. Provisional Patent Application Ser. No. 61/507685 filed Jul. 14, 2011, and U.S. Provisional Patent Application Ser. No. 61/548832 filed Oct. 19, 2011, both of which are incorporated herein by reference in their entirety.

TECHNICAL FIELD

The present invention relates generally to copolymers and compositions thereof that encompass both norbornene-type repeating units and non-norbornene-type repeating units that are useful for forming self-imageable layers, and more specifically to such copolymers and compositions thereof that encompass both repeating units derived from norbornene-type monomers with repeating units derived from maleic anhydride-type monomers for providing self-imageability to layers made therefrom when such layers are image-wise exposed to actinic radiation.

BACKGROUND

The microelectronic, such as semiconductor and optoelectronic, industries have seen the requirement for smaller and smaller device geometries over the past several years. While in some areas of device fabrication sub-micron device geometries have been common place for a number of years, in other areas, such as liquid crystal displays (LCDs), organic light emitting diodes (OLEDs) and a variety of radio frequency (RI) and microwave devices (e.g. RFICs/MMICs, switches, couplers, phase shifters, SAW filters and SAW duplexers), such device geometries are only recently approaching sub 10 micron levels.

With such smaller geometries comes a requirement for dielectric materials with low dielectric constants to reduce or eliminate any cross-talk between adjacent signal lines or between a signal line and a device feature (e.g. a pixel electrode) due to capacitive coupling, Although many low dielectric (low-K) materials are available for microelectronic devices, for optoelectronic devices such materials must also be broadly transparent in the visible light spectrum, not require high temperature processing (greater than 300° C.) that would be incompatible with other elements of such an optoelectronic device, and be both low-cost and feasible for large scale optoelectronic device fabrication.

Thus, it would be desirable to have a material capable of forming a self-imageable layer to avoid the used for depositing a separate imaging layer. Such material should also be easy to apply to a substrate, have a low dielectric constant (3.9 or less) and thermal stability to temperatures in excess of 250° C.

BRIEF DESCRIPTION OF THE DRAWINGS

Embodiments in accordance with the present invention are described below with reference to the following accompanying figures and/or images. Where drawings are provided, it will be drawings which are simplified portions of a device provided for illustrative purposes only.

DETAILED DESCRIPTION

Figure 1:
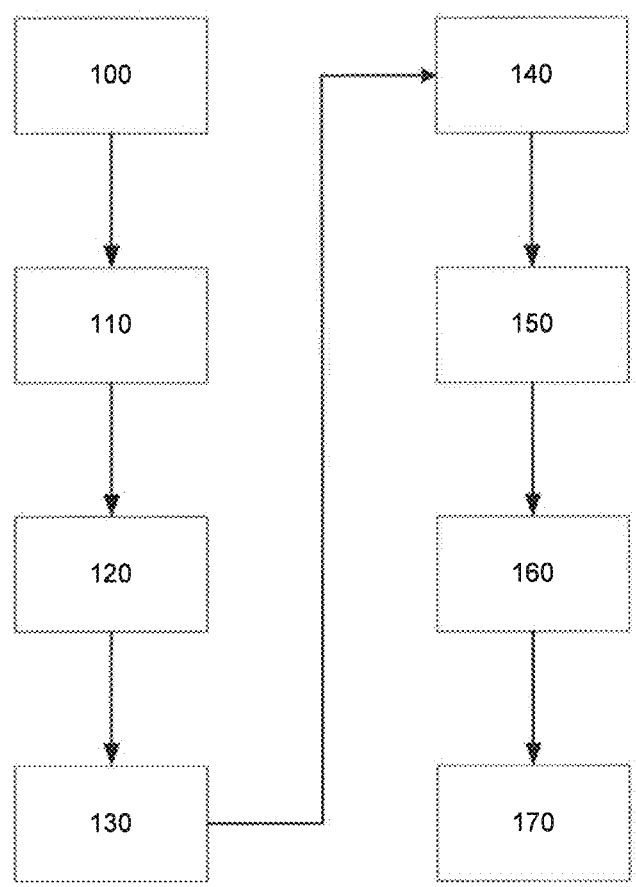
FIG. 1 is a flow diagram that depicts a method of making a (DRM) ROMA copolymer embodiment in accordance with the present invention'

Embodiments in accordance with the present invention are directed to copolymers that encompass at least one repeating unit derived from a norbornene-type monomer and at least one repeating unit derived from a maleic anhydride-type monomer, as such are defined hereinafter, and to compositions encompassing such copolymers, Such copolymer compositions being capable of forming self-imageable films useful as layers in the manufacture of microelectronic and optoelectronic devices. That is to say that, after image-wise exposure to actinic radiation, such layers (or films) can be developed to form patterned layers (or films), where such pattern is reflective of the image through which the layers (or films) was exposed. In this manner, structures can be provided that are, or are to become, a part of such microelectronic and/or optoelectronic devices.

As used herein, the articles "a," "an," and "the" include plural referents unless otherwise expressly and unequivocally limited to one referent.

Since all numbers, values and/or expressions referring to quantities of ingredients, reaction conditions, etc., used herein and in the claims appended hereto, are subject to the various uncertainties of measurement encountered in obtaining such values, unless otherwise indicated, all are to be understood as modified in all instances by the term "about."

Where a numerical range is disclosed herein such range is continuous, inclusive of both the minimum and maximum values of the range as well as every value between such minimum and maximum values. Still further, where a range refers to integers, every integer between the minimum and maximum values of such range is included. In addition, where multiple ranges are provided to describe a feature or characteristic, such ranges can be combined. That is to say that, unless otherwise indicated, all ranges disclosed herein are to be understood to encompass any and all sub-ranges subsumed therein. For example, a stated range of from "1 to 10" should be considered to include any and all sub-ranges between the minimum value of 1 and the maximum value of 10. Exemplary sub-ranges of the range 1 to 10 include, but are not limited to, 1 to 6.1, 3.5 to 7.8, and 5.5 to 10.

As used herein, the terms "copolymer composition" or "polymer composition" are used herein interchangeably and are meant to include at least one synthesized polymer or copolymer, as well as residues from initiators, solvents or other elements attendant to the synthesis of such copolymers, where such residues are understood as not being covalently incorporated thereto. Such residues and other elements considered as part of the polymer composition are typically mixed or co-mingled with the polymer such that they tend to remain therewith when it is transferred between vessels or between solvent or dispersion media. A copolymer composition can also include materials added after synthesis of the copolymer to provide or modify specific properties of such composition.

As used herein, "hydrocarbyl" refers to a radical of a group that contains carbon and hydrogen atoms, non-limiting examples being alkyl, cycloalkyl, aryl, aralkyl, alkaryl, and alkenyl. The term "halohydrocarbyl" refers to a hydrocarbyl group where at least one hydrogen has been replaced by a halogen. The term perhalcarbyl refers to a hydrocarbyl group where all hydrogens have been replaced by a halogen.

As used herein, "alkyl" refers to a methyl or ethyl group and a linear or branched acyclic or cyclic, saturated hydrocarbon group having a carbon chain length of, for example, from appropriate $C_3$ to $C_{25}$ groups. Non-limiting examples of suitable alkyl groups include, but are not limited to, $—CH_2)_3CH_3$, $—(CH_2)_4CH_3$, $—(CH_2)_5CH_3$, $—(CH_2)_9CH_3$, $—(CH_2)_{23}CH_3$, cyclopentyl, and cyclohexyl.

As used herein the term "aryl" refers to aromatic groups that include, without limitation, groups such as phenyl, biphenyl, benzyl, xylyl, naphthalenyl, anthracenyl and the like.

The terms "alkaryl" or "aralkyl" are used herein interchangeably and refer to a linear or branched acyclic alkyl group substituted with at least one aryl group, for example, phenyl, and having an alkyl carbon chain length of appropriate $C_1$ to $C_{25}$. It will further be understood that the above acyclic alkyl group can be a haloalkyl or perhaloalkyl group.

As used herein the term "alkenyl" refers to ethylene or a linear or branched acyclic or cyclic hydrocarbon group having at least one double bond and having an alkenyl carbon chain length of appropriate $C_3$ to $C_{25}$. Non-limiting examples include, among others, vinyl groups, propenyl, butenyl and the alike.

As used herein the term "heterohydrocarbyl" refers to any of the previously described hydrocarbyls, halohydrocarbyls and perhalohydrocarbyls where at least one carbon of the carbon chain is replaced with N, O, S, Si or P. Non-limiting examples include heterocyclic aromatic groups such as pyrrolyl, furanyl, and the like, as well as non-aromatic groups such as ethers, thioethers and silyl ethers. The term "alkylol" refers to alkyl groups that include at least one hydroxyl group.

It will additionally be understood that any of the hydrocarbyl, halohydrocarbyl, perhalohydrocarbyl and heterohydrocarhyl moieties described above can be further substituted, if desired. Non-limiting examples of suitable substituent groups include, among others, hydroxyl groups, benzyl groups, carboxylic acid and carboxylic acid ester groups, amides and imides.

Embodiments in accordance with the present invention encompass copolymers having at least one repeating unit derived from a norbornene-type monomer as defined herein below and at least one repeating unit derived from a maleic anhydride-type monomer as defined herein below.

The terms "norbornene-type", "polycycloolefin" and "poly(cyclic) olefin" are used interchangeably herein and refer to monomers (or the resulting repealing unit), that encompass at least one norbornene moiety such as the moiety shown below:

Such moiety is the simplest norbornene-type or poly(cyclic) olefin monomer, bicyclo[2.2.1]hept-2-ene, commonly referred to as norbornene. As described above, the term "norbornene-type" monomer or repeating unit is used herein to encompass norbornene itself as well as any substituted norbornene(s), and any substituted and unsubstituted higher cyclic derivatives thereof. Formulae I and Ia, shown below, are representative of norbornene-type monomers and norbornene-type repeating units encompassed by embodiments in accordance with the present invention, respectively:

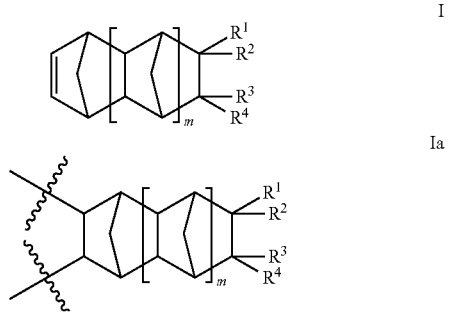

where m is an integer ranging from 0 to 5 and each occurrence of $R^1$, $R^2$, $R^3$ and $R^4$ independently represents hydrogen or a hydrocarbyl.

As used herein, the term "maleic anhydride-type" will be understood to refer to monomers that encompass at least one maleic anhydride-type moiety such shown below by Formula II and to repeating units derived therefrom, such as shown below by Formulae IIa, IIb and IIc:

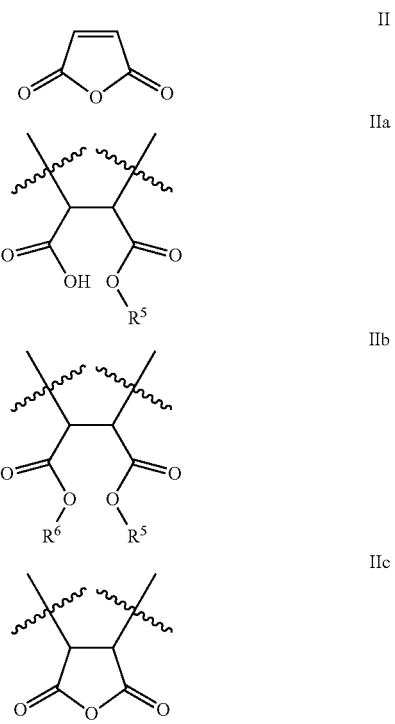

where $R^5$ and $R^6$ are the same or different hydrocarbyl.

It will also be understood that the term "maleic anhydride-type monomer" is inclusive of monomers in accordance with Formula III

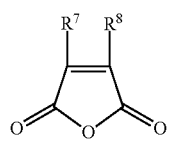

III where $R^7$ and $R^8$ are the same or different and are selected from hydrogen, methyl and ethyl. Further it will understood that just as the repeat units of Formulae III, IIb and IIc can be derived from the monomer of Formula analogous repeat units can be derived from the maleic anhydride-type monomer of Formula III and are encompassed by embodiments in accordance with the present invention.

Useful monomers for embodiments in accordance with the present invention are described generally herein and are further described by the monomer and substituent structures provided herein. With regard to the polymer composition embodiments of the present invention, it will be noted that such compositions can encompass a single copolymer encompassing at least one norbornene-type repeating unit and at least one maleic anhydride-type repeating unit. In other embodiments, such polymer compositions can encompass a single copolymer encompassing two or more distinct types of norbornene-type repeating units and at least one maleic anhydride-type repeating unit, or a single copolymer encompassing at least one norbornene-type repeating unit and two or more distinct types of maleic anhydride-type of repeating units.

In still other embodiments, the polymer compositions can encompass a blend of polymers encompassing at least two polymers such as described above or one or more of such a copolymer and a norbornene-type homopolymer.

When any of $R^1$, $R^2$, $R^3$, $R^4$, $R^5$ and $R^6$ is a hydrocarbyl group, such group can alternately be described as being any $C_1$ to $C_{30}$ alkyl, aryl, aralkyl, alkaryl, cycloalkyl, or heteroalkyl group. Representative alkyl groups include, but are not limited to, methyl, ethyl, propyl, isopropyl, butyl, isobutyl, sec-butyl, tert-butyl, pentyl, neopentyl, heptyl, octyl, nonyl, and decyl. Representative cycloalkyl groups include, but are not limited to, adamantyl, cyclopentyl, cyclohexyl, and cyclooctyl. Representative aryl groups include, but are not limited to, phenyl, naphthyl, and anthracenyl. Representative aralkyl groups include, but are not limited to, benzyl and phenethyl. In addition, it should be noted that the hydrocarbyl groups mentioned above can be substituted, that is to say at least one of the hydrogen atoms can be replaced with, for example, $C_1$-$C_{10}$ alkyl, haloalkyl, perhaloalkyl, aryl, and/or cycloalkyl group(s). Representative substituted cycloalkyl groups include, among others, 4-t-butylcyclohexyl and 2-methyl-2-adamantyl. A non-limiting representative substituted aryl group is 4-t-butylphenyl.

Further, any one or more of $R^1$ to $R^6$ can also be a halohydrocarbyl group, where such group includes any of the hydrocarbyls mentioned above where at least one, but less than all, of the hydrogen atoms of the hydrocarbyl is replaced by a halogen (fluorine, chlorine, bromine or iodine). Additionally, any one or more of $R^1$ to $R^6$ can be a perhalocarbyl group, where such group includes any of the hydrocarbyls mentioned above where all of the hydrogen atoms of the hydrocarbyl are replaced by a halogen. Representative perfluorinated substituents include, but are not limited to, perfluorophenyl, perfluoromethyl, perfluoroethyl, perfluoropropyl, perfluorobutyl, and perfluorohexyl.

In some embodiments the perhalohydrocarbyl groups can include perhalogenated phenyl and perhalogenated alkyl groups. In other embodiments, the perfluorinated groups can include perfluorophenyl, perfluoromethyl, perfluoroethyl, perfluoropropyl, perfluorobutyl, and perfluorohexyl. In addition to halogen substituents, cycloalkyl, aryl and aralkyl groups of such embodiments can be substituted with any $C_1$-$C_5$ alkyl, $C_1$-$C_{12}$ haloalkyl, aryl, and/or cycloalkyl group.

As mentioned above, embodiments in accordance with the present invention are directed to copolymers encompassing both norbornene-type repeating units and maleic-anhydride type repeating units and compositions made therefrom. Such copolymer compositions being capable of forming films useful as self-imageable layers in the manufacture of microelectronic and optoelectronic devices. That is to say that when image-wise exposed to actinic radiation, such layers (or films) can be developed to form a patterned film, where such pattern is reflective of the image through which the film was exposed.

In this manner, structures can be provided that are, or are to become, a part of such microelectronic and/or optoelectronic devices. For example, such films may be useful as low-K dielectric layers in liquid crystal displays or in microelectronic devices. It will be noted that such examples are only a few of the many uses for such a self-imageable film, and such examples do not serve to limit the scope of such films or the polymers and polymer compositions that are used to form them.

Thus embodiments in accordance with the present invention encompass copolymers encompassing repeating units derived from the monomers described hereinabove and which are obtainable via free radical polymerization reaction using methods known to those skilled in the art to form a copolymer intermediate encompassing at least one type of norbornene-type repeating unit and maleic anhydride repeating units. Non-limiting examples of initiators that may be used in the free radical polymerization reaction include, for instance, azo compounds and organic peroxides. Non-limiting examples of azo compounds include azobisisobutyronitrile (AIBN), (E)-dimethyl 2,2'-(diazene-1,2-diyl)bis(2-methylpropanoate (AMMP), (E)-2,2'-(diazene-1,2-diyl)bis(2,4-dimethylpentanenitrile (ADMPN) and 1,1'-azobis(cyclohexanecarbonitrile) (ABCN). Non-limiting examples of organic peroxides include hydrogen peroxide, di-t(tertiary)-butyl peroxide, benzoyl peroxide, and methyl ethyl ketone peroxide.

Some polymer embodiments in accordance with the present invention, are formed from the aforementioned copolymer intermediate by contacting such intermediate with reagent(s) sufficient to cause the maleic anhydride repeating units to ring open and thus form repeating units in accordance with Formulae IIa and/or IIb. Such a polymer embodiment being represented by Formula IVa, where generally, norbornene-type repeating units and maleic anhydride-type repeating units are found to be alternating.

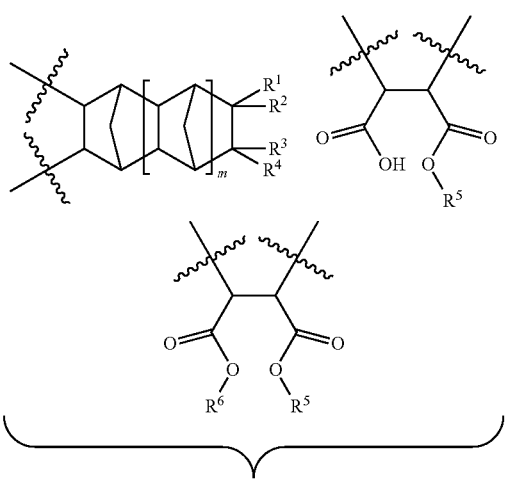

Other copolymer embodiments in accordance with the present invention, encompass at least one norbornene-type repeating unit in accordance with Formula Ia, at least one ring-opened maleic-anhydride-type repeating unit in accordance with Formulae IIa and/or IIb, and a repeating unit in accordance with Formula IIc as shown by Formula IVb. The norbornene-type repeating units and maleic anhydride-type repeating units of a copolymer embodiment represented by Formula IVb, again, are found to be alternating.

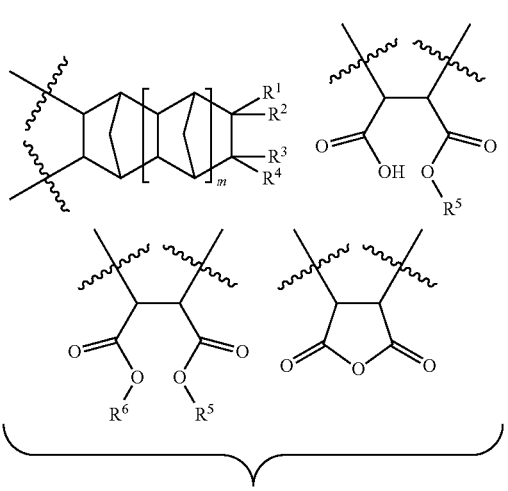

where for Formulae IVa and IVb, $R^1$, $R^2$, $R^3$, $R^4$, $R^5$ and $R^6$ are as previously defined and while not specifically shown, it will be understood that Formulae IVa and IVb are inclusive of maleic anhydride-type repeating units derived from the monomer represented by Formula III.

Polymer composition embodiments in accordance with the present invention generally encompass, in addition to a polymer embodiment, at least one casting solvent, at least one Photo Active Compound (PAC) and at least one epoxy resin, where such epoxy resin encompasses at least two epoxy groups.

Exemplary casting solvents include, but are not limited to, propylene glycol monomethyl ether (PGME), propylene glycol monomethyl ether acetate (PGMEA), ethyl lactate, methyl isobutyl carbinol (MIBC), gamma butyrolactone (GBL), N-Methylpyrrolidone (NMP) and methyl n-amyl ketone (MAK) and mixtures thereof.

Exemplary PACs include, but are not limited to, PAC-5570 (St. Jean Photochemicals Inc., Quebec, Canada) SCL6 (Secant Chemicals Inc., Winchendon, Mass., USA), Tris-P 3M6C-2-201 (also referred to herein as TrisP), TS-200, TS-250, TS-300 and 4NT-300 (all from Toyo Gosei Co. Ltd., Chiba, Japan), the structures of which are depicted below:

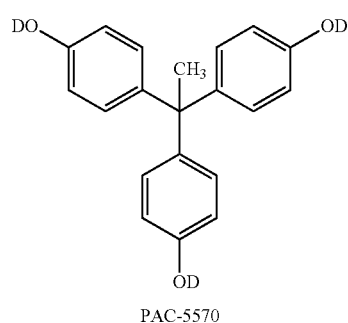

PAC-5570

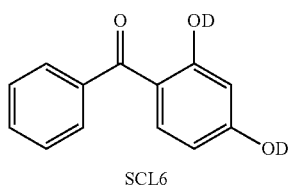

SCL6

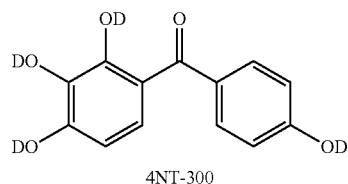

4NT-300

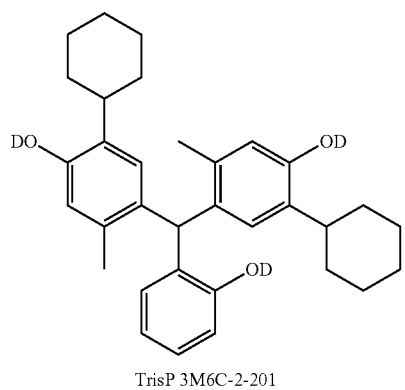

TrisP 3M6C-2-201

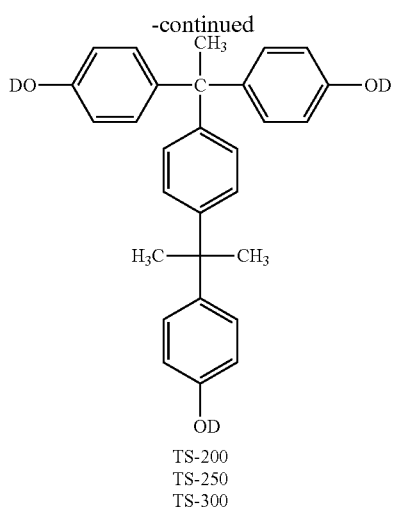

TS-200
TS-250
TS-300

For TS-200, 67% of D is DNQ, For TS-250, 83% of D is DNQ, For TS-300, 100% of D DNQ; and where 'D' or 'Q' refers to DNQ which is one of the diazonaphthoquinone-type structures below, or a hydrogen atom.

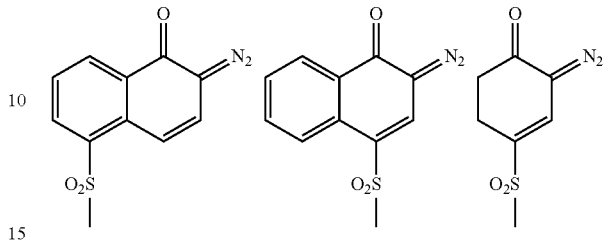

Exemplary PACs also include, but are not limited to, the PACs disclosed in U.S. Pat. No. 7,524,594 beginning at column 13, line 39 and continuing through Collective Formula 9z at column 20. Such PACs being provided below.

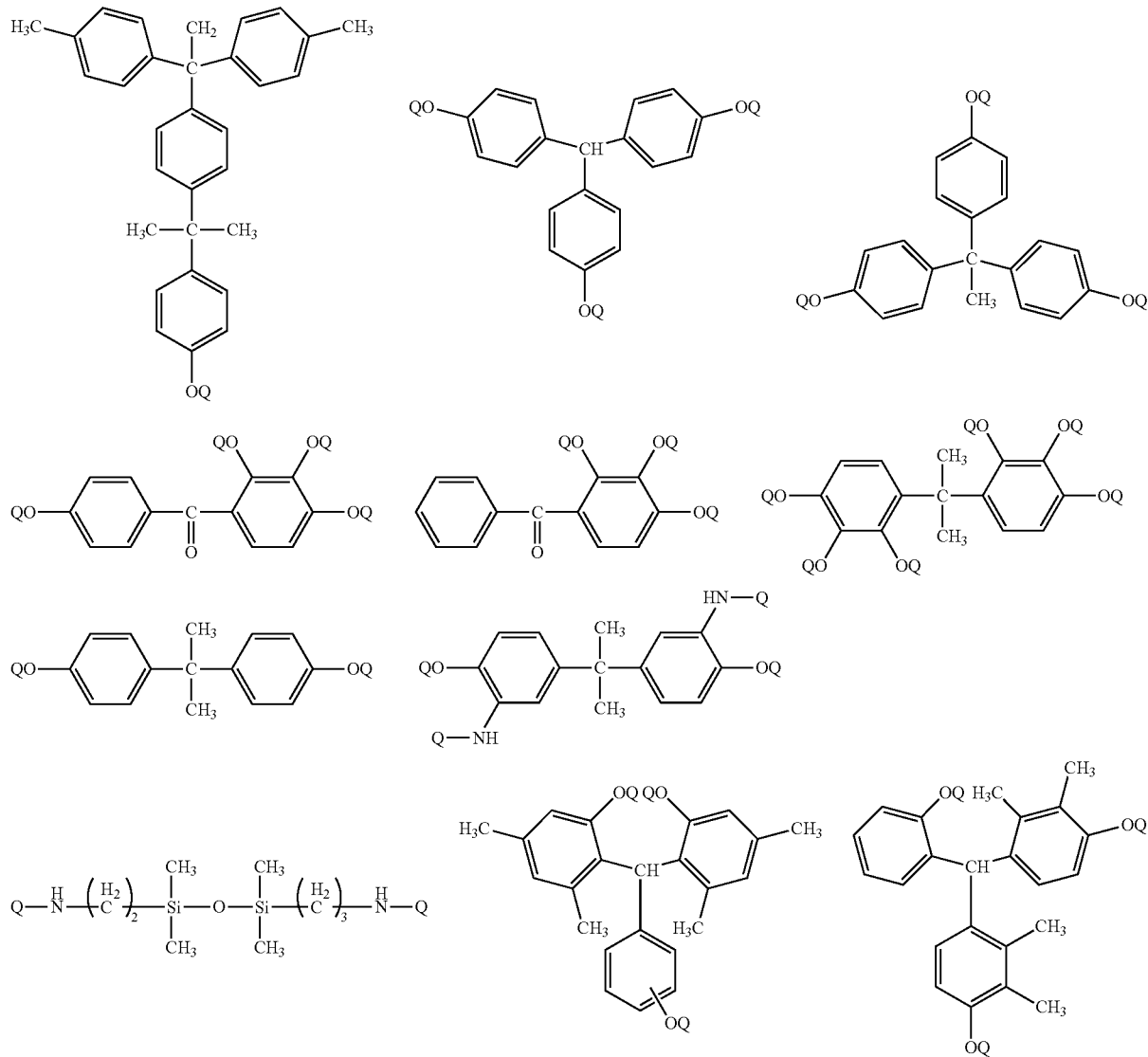

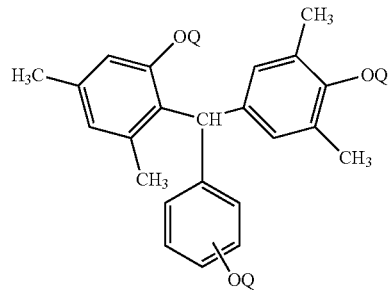
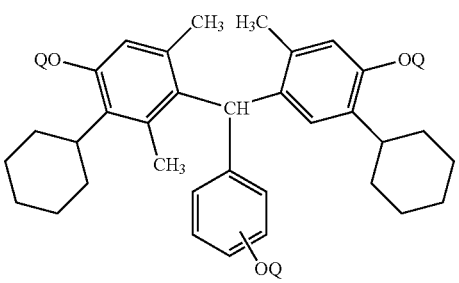
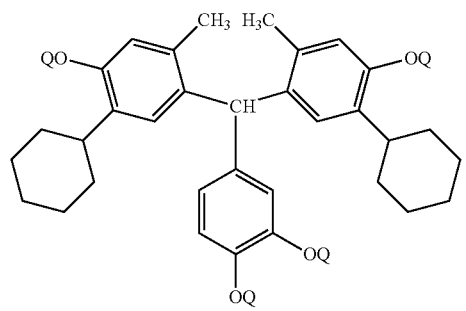
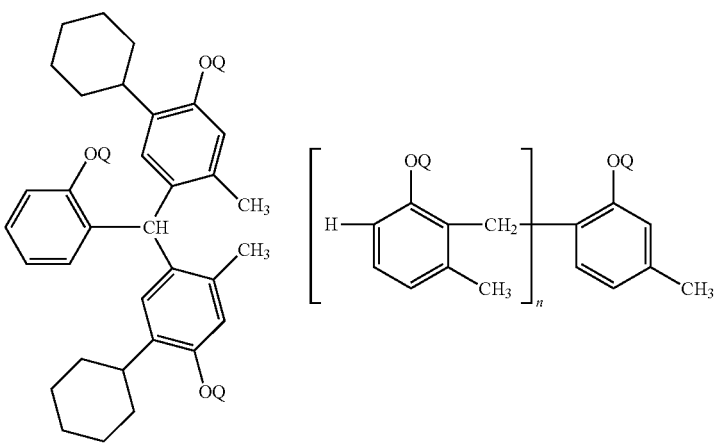
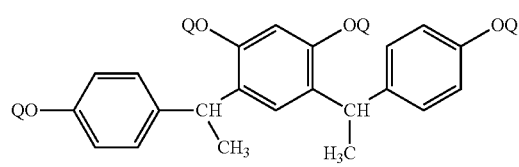
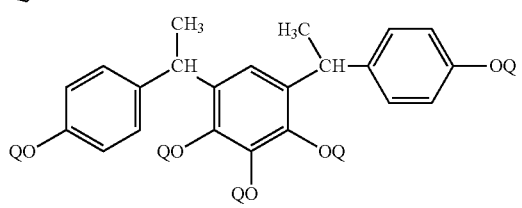
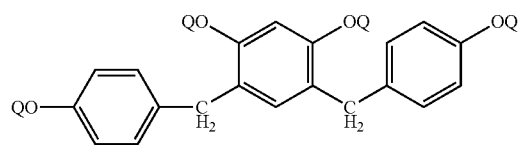
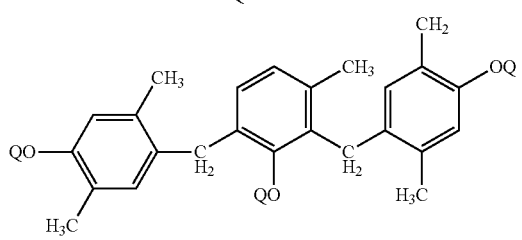
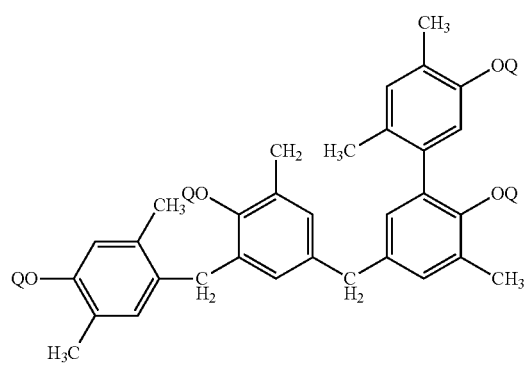
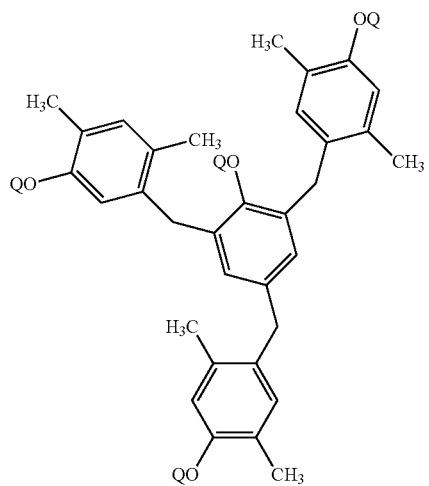

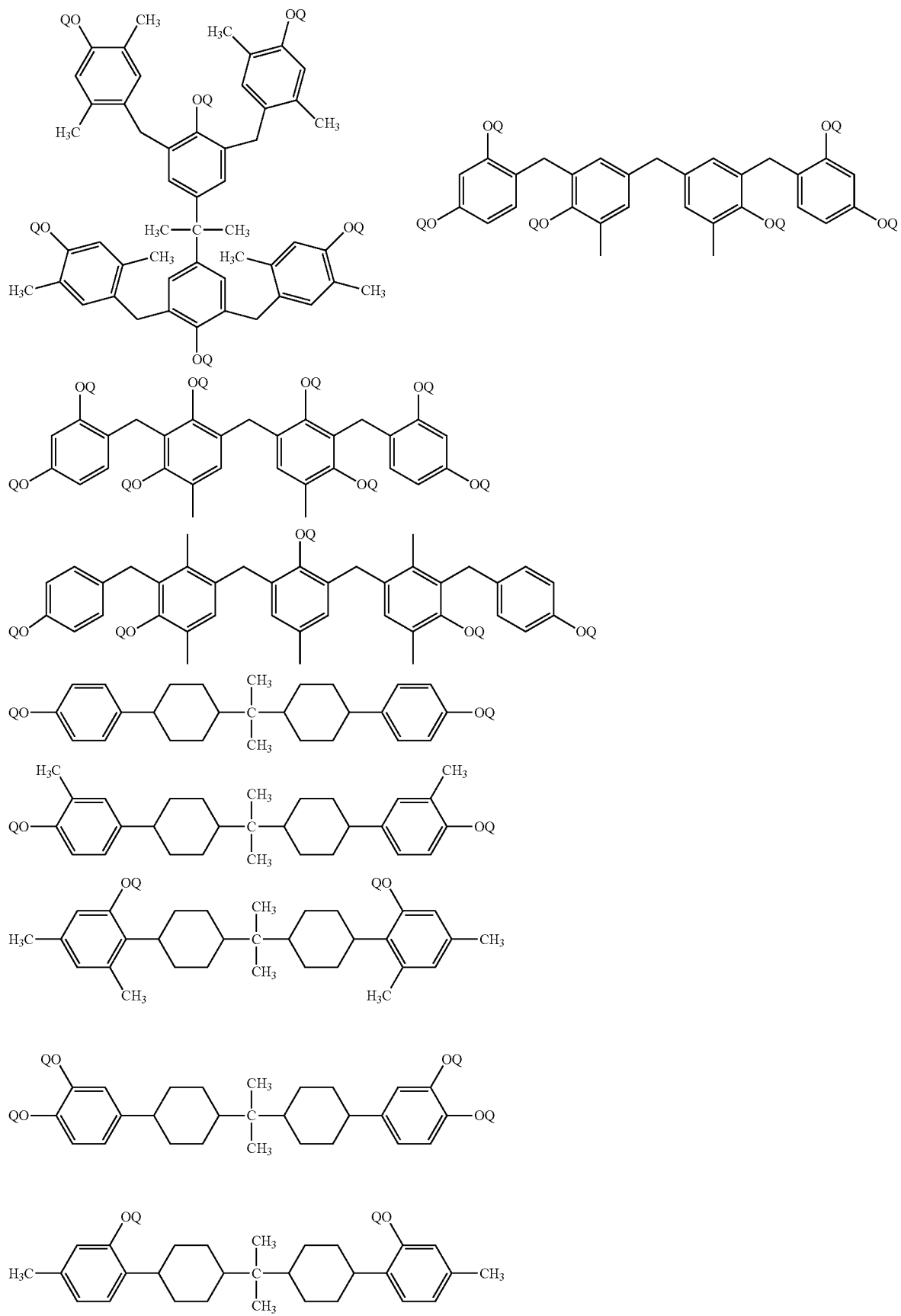

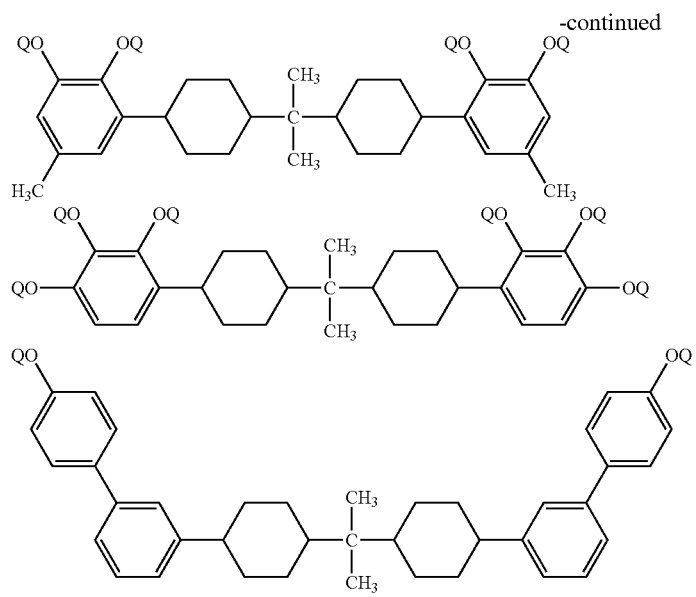

Exemplary epoxies and other cross-linking additives, as mentioned above, include, but are not limited to, bisphenol A epoxy resin (LX-1—Daiso Chemical Co., Osaka, Japan), 2,2'-((((1(4-(2-(4-(oxiran-2-ylmethoxy)phenyl)propan-2-yl)phenyl)ethane-1,1diyl)bis(4,1- phenylene))bis(oxy))bis(methylene))bis(oxirane)(Technmore VG3101L—Mitsui Chemical Inc.), trimethylolpropane triglycidylether (TMPTGE—CVC Specialty Chemicals, Inc.), and 1,1,3,3,5,5-hexamethyl-1,5-bis(3-(oxiran-2-ylmethoxy)propyl)trisiloxane (DMS-E09—Gelest, Inc.) as shown below:

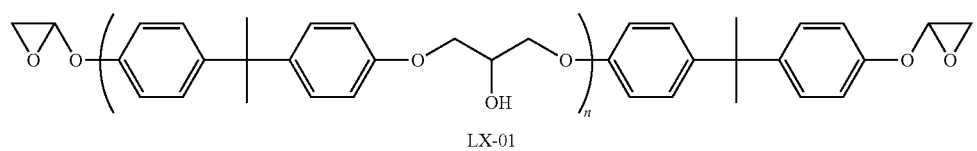
LX-01

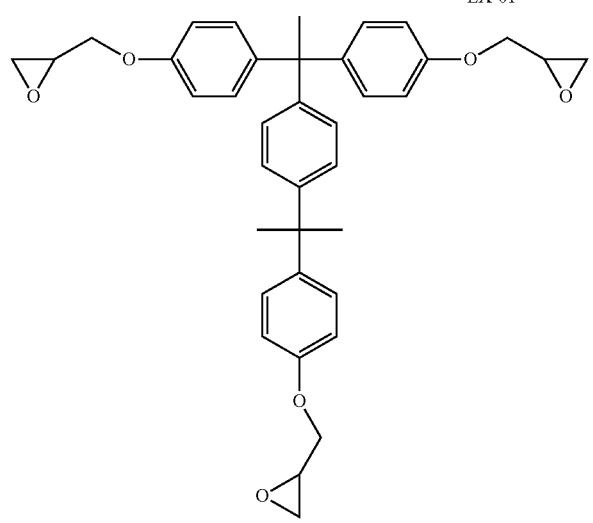
Techmore VG3101L

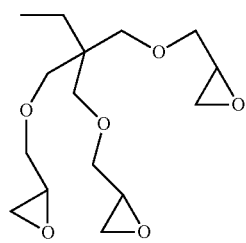
TMPTGE

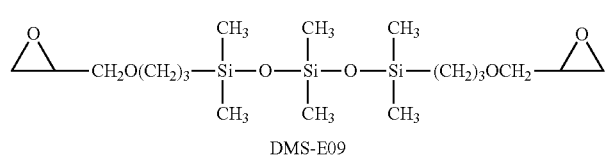
DMS-E09

Still other exemplary epoxy resins or cross-linking additives include, among others Araldite MTO163 and Araldite CY179 (manufactured by Ciba Geigy); and EHPE-3150, Epolite GT300 and (manufactured by Daicel Chemical).

Some embodiments of the present invention encompass structures, such as optoelectronic structures, which include at least one self-imageable layer formed from a film of a copolymer composition embodiment in accordance with the present invention. As previously mentioned, the copolymer of such a composition embodiment encompasses at least one repeating unit derived from a norbornene-type monomer and at least one repeating unit derived from a maleic anhydride-type monomer. The polymer composition embodiment further encompassing at least one casting solvent, at least one photo active compound (PAC) and at least one epoxy resin.

With regard to the composition embodiments of the present invention, such embodiments provide for "positive tone" self-imageable films. Generally, for positive tone compositions, exposed portions of a layer formed from such composition become more soluble in a developer solution than portions unexposed to such radiation. In each case, the more soluble portions are washed away during an image development process using an aqueous base solution. The aforementioned exposed portions' increased solubility in aqueous base being the result of the at least one PAC added to the composition generating a carboxylic acid which enhances the solubility of the exposed portion in an aqueous alkali solution as compared to any unexposed portions where the PAC remains unchanged.

The aforementioned structure embodiments of the present invention are readily formed by first casting a polymer composition over an appropriate substrate to form a layer thereof, then heating the substrate to an appropriate temperature for an appropriate time, where such time and temperature are sufficient to remove essentially all of the casting solvent of such composition. After such first heating, the layer is image-wise exposed to an appropriate wavelength of actinic radiation. As one of skill in the art knows, the aforementioned image-wise exposure causes the PAC contained in exposed portions of the layer to undergo a chemical reaction that enhances the dissolution rate of such exposed portions to an aqueous base solution (generally a solution of tetramethyl ammonium hydroxide (TMAH)). In this manner, such exposed portions are removed and unexposed portions remain. Next a second heating is performed to cause cross-linking of portions of the polymer with the epoxy additive, thus essentially "curing" the polymer of such unexposed portions to form an aforementioned structure embodiment of the present invention.

The following examples, without being limiting in nature, illustrate methods for making copolymer embodiments in accordance with the present invention. Such examples illustrate first forming the previously mentioned copolymer intermediate, referred to herein as a cyclic olefin maleic anhydride (COMA) copolymer. Additionally, such examples describe forming ring-opened analogs of such COMA copolymer intermediates, referred to herein as ROMA copolymers, and further still, such examples disclose forming dissolution rate modified (DRM) ROMA copolymers.

Referring now to FIG. 1, a general process flow useful for forming such (DRM) ROMA copolymers is provided. Specifically, Step 100 is the polymerization of a norbornene-type monomer and maleic anhydride in an appropriate polymerization solvent to form the aforementioned COMA copolymer. In Step 110, the solution of such COMA copolymer first treated with a mixture of a strong base to open the anhydride ring an alcohol, for example methanol or butanol, to form a ROMA copolymer having monoester and salt moieties. Such ROMA copolymer is then treated with an acid such as formic acid or aqueous hydrochloric acid in Step 120 to convert the carboxylic acid salt moiety to its acid form. In Step 130 the ROMA copolymer of Step 120 is washed with an appropriate mixture of aqueous and organic solvents to remove any remaining inorganics leaving the copolymer and any aqueous insoluble residual monomers in an organic phase. This is followed by Step 140 where another mixture of aqueous and organic solvents is used to extract such residual monomers leaving a solution of an essentially pure ROMA copolymer. In Step 150, the ROMA copolymer of Step 140 is heated in the presence of an excess of an alcohol to take advantage of the equilibrium shown below, thereby reducing the concentration of carboxylic acid moiety of the ROMA copolymer to reduce the copolymer's solubility, and hence its dissolution rate (DR) in aqueous base, thus forming the aforementioned (DRM) ROMA copolymer. In Step 160, the (DRM) ROMA copolymer is purified and generally transferred by a solvent exchange process to an appropriate casting solvent. In Step 170, additives such as an appropriate PAC and an appropriate crosslinking compound are added to form a useable (DRM) ROMA copolymer composition.

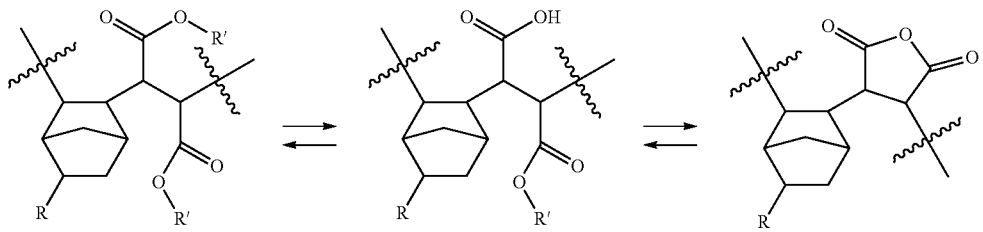

In addition, such examples illustrate forming copolymer composition embodiments in accordance with the present invention and discuss the various evaluations performed on such copolymer, copolymer composition and film embodiments of the present invention that serve to characterize such embodiments.

With regard to characterization testing, molecular weights (Mw and Mn) were determined by Gel Permeation Chromatography (GPC) using polystyrene standards. Where Gas Chromatography was used

COMA COPOLYMER EXAMPLES

Examples A1 through A5 illustrate exemplary methods of forming copolymers derived from a norbornene-type monomer and a maleic anhydride monomer.

Example A1

Polymer Synthesis of MA/NB

Maleic Anhydride (MA, 7.4 g, 75.0 mmol), 2-Norbornene (NB, 7.1 g, 75.0 mmol) and AIBN (1.2 g, 7.5 mmol) was dissolved in THF (20.4 g) and charged to an appropriately sized reaction vessel. The solution was sparged with nitrogen for 10 min to remove oxygen and then heated to 70° C. The mixture was allowed to stir at 70° C. for 5.0 hr, after which the solution was cooled to room temperature. The reaction mixture was then diluted with 2.0 g of THF and was added to hexane (1 L) to give a white powder that was filtered and dried in a vacuum oven at 80° C. for 16 hr. Approximately, 13.0 g (90%) of the MA/NB polymer was isolated (GPC Mw=4,100 Mn=1,800).

Example A2

Polymer Synthesis of MA/BuNB

Maleic Anhydride (MA, 9.8 g, 100 mmol), 5-Butyl-2-norbornene (BuNB, 15.0 g, 100 mmol) and AIBN (1.64 g, 10.0 mmol) was dissolved in THF (37.2 g) and charged to an appropriately sized reaction vessel. The solution was sparged with nitrogen for 10 min to remove oxygen and then heated to 70 ° C. The mixture was allowed to stir at 70° C. for 16 hr, after which the solution was cooled to room temperature. The reaction mixture was added to hexane (2 L) to give a white powder that was filtered and dried in a vacuum oven at 80° C. for 1 hr. Approximately, 19.3 g (78%) of the MA/BuNB polymer was isolated (GPC Mw=3,200 Mn=1,900).

Example A3

Polymer Synthesis of MA/NB/BuNB

Maleic Anhydride (MA, 7.4 g, 75.0 mmol), 2-Norbornene (NB, 3.5 g, 37.5 mmol), 5-Butyl-2-norbornene (BuNB, 5.6 g, 37.5 mmol) and AIBN (1.2 g, 7.5 mmol) was dissolved in THF (23.6 g) and charged to an appropriately sized reaction vessel. The solution was sparged with nitrogen for 10 min to remove oxygen and then heated to 70° C. The mixture was allowed to stir at 70° C. for 20.5 hr, after which the solution was cooled to room temperature. The reaction mixture was diluted with 20 g of THF and added to hexane (1 L) to give a white powder that was filtered and dried in a vacuum oven at 80° C. for 16 hr. Approximately, 14.5 g (88%) of the MA/NB/BuNB polymer was isolated (GPC Mw=3,500 Mn=1,700).

Example A4

Polymer Synthesis of MA/HxNB/NBC$_4$F$_9$

Maleic Anhydride (MA, 7.4 g, 75.0 mmol), 5-Hexyl-2-norbornene (HxNB, 10.7 g, 60.0 mmol), 5-Perfluorobutyl-2-norbornene (NBC$_4$F$_9$, 4.7 g, 15.0 mmol) and AIBN (1.23 g, 7.5 mmol) was dissolved in THF (30.4 g) and charged to an appropriately sized reaction vessel. The solution was sparged with nitrogen for 10 min to remove oxygen and then heated to 70° C. The mixture was allowed to stir at 70° C. for 20.5 hr, after which the solution was cooled to room temperature. The reaction mixture was added to hexane (1 L) to give a white powder that was filtered and dried in a vacuum oven at 80° C. for 16 hr. Approximately, 14.3 g (66%) of the MA/HxNB/NBC$_4$F$_9$ polymer was isolated (GPC Mw=3,200 Mn=2,000).

Example A5

Polymer Synthesis of MA/PENB

Maleic Anhydride (MA, 7.4 g, 75.0 mmol), Phenyl Ethyl Norbornene (PENB, 14.9 g, 75.0 mmol) and AIBN (1.2 g, 7.5 mmol) was dissolved in THF (32.1 g) and charged to an appropriately sized reaction vessel. The solution was sparged with nitrogen for 10 min to remove oxygen and then heated to 70° C. The mixture was allowed to stir at 70° C. for 17.5 hr, after which the solution was cooled to room temperature. The reaction mixture was diluted with 30 g of THF and added to hexane (1 L) to give a white powder that was filtered and dried in a vacuum oven at 80° C., for 16 hr. Approximately, 16.7 g (75%) of the MA/PENB polymer was isolated (GPC Mw=3,400 Mn=1,500).

ROMA Copolymer Synthesis

Examples B1 through B5 illustrate a method of ring-opening the maleic anhydride repeating units of the COMA copolymers of Examples A1 through A5 with BuOH, respectively. Examples B6 and B7 illustrate a method of both forming a COMA copolymer of MA and PENB and ring-opening the maleic anhydride repeating units that COMA copolymer with BuOH, Examples B8 through B12 illustrate methods of ring-opening the COMA copolymer of Example A1 with different alcohols. Examples B13 and B14 illustrate a method of both forming a COMA copolymer of MA and PENB and ring-opening the maleic anhydride repeating units that COMA copolymer with MeOH. Example B15 illustrates a method of first forming a COMA copolymer, ring-opening that copolymer to form a ROMA copolymer and then performing a dissolution rate modification of that ROMA copolymer. Example 15 is consistent with the process depicted in FIG. 1.

Example B1

ROMA Copolymer of MA/NB with BuOH

An appropriately sized reaction vessel was loaded with NaOH (2.3 g, 57.3 mmol), BuOH (19.3 g, 260 mmol) and THF (20.0 g). The mixture was allowed to stir for 1 hr at 70° C. and then the polymer obtained in Example 1 (10.0 g) in 20 g of THF was added. After 3 hr of the reaction at 70° C., the mixture was cooled to room temperature. The reaction mixture was treated with conc. HClaq for protonation, and then washed three times to remove residual salts and acid. The organic phase was separated and then concentrated in vacuo, redissolved in THF to form an approximately 20 wt % copolymer solution and then the copolymer was precipitated by adding the THF solution to hexane (20 fold excess). The copolymer was separated by filtration and dried in a vacuum oven at 80° C. for 16 hr. Approximately, 10.1 g (73%) of the ROMA polymer of MA/NB with BuOH was isolated (GPC Mw=4,400 Mn=2,400).

Example B2

ROMA Copolymer of MA/BuNB with BuOH

An appropriately sized reaction vessel was loaded with NaOH (0.9 g, 22.3 mmol), BuOH (7.5 g, 100.6 mmol) and THF (15.0 g). The mixture was allowed to stir for 1 hr at 70° C. and then the polymer obtained in Example 2 (5.0 g) in 7.5 g of THF was added. After 3 hr of the reaction at 70° C., the mixture was cooled to room temperature. The reaction mixture was treated with conc. HClaq for protonation, and then washed three times to remove residual salts and acid. The organic phase was separated and then concentrated in vacuo, redissolved in THF to form an approximately 20 wt % copolymer solution and then the copolymer was precipitated by adding the THF solution to hexane (20 fold excess). The copolymer was separated by filtration and dried in a vacuum oven at 80° C. for 16 hr. Approximately, 4.7 g (72%) of the Ring-opening polymer of MA/BuNB with BuOH was isolated (GPC Mw=3,800 Mn=2,300).

Example B3

ROMA Copolymer of MA/NB/BuNB with BuOH

An appropriately sized reaction vessel was loaded with NaOH (2.00 g, 50.0 mmol), BuOH (16.82 g, 227 mmol) and THF (15.0 g). The mixture was allowed to stir for 1 hr at 70° C. and then the polymer obtained in Example 3 (10.0 g) in 15.0 g of THF was added. After 3 hr of the reaction at 70° C., the mixture was cooled to room temperature. The reaction mixture was treated with conc. HClaq for protonation, and then washed three times to remove residual salts and acid. The organic phase was separated and then concentrated in vacuo, redissolved in THF to form an approximately 20 wt % copolymer solution and then the copolymer was precipitated by adding the THF solution to hexane (20 fold excess). The copolymer was separated by filtration and dried in a vacuum oven at 80° C. for 16 hr. Approximately, 10.2 g (76%) of the Ring-opening polymer of MA/NB/BuNB with BuOH was isolated (GPC Mw3,800 Mn=2,200).

Example B4

ROMA Copolymer of MA/HxNB/NBC$_4$F$_9$ with BuOH

An appropriately sized reaction vessel was loaded with NaOH (1.45 g, 36.3 mmol), BuOH (12.22 g, 165 mmol) and THF (20.0 g). The mixture was allowed to stir for 1 hr at 70° C. and then the polymer obtained in Example 4 (10.00 g) in 15.0 g of THF was added. After 3 hr of the reaction at 70° C., the mixture was cooled to room temperature. The reaction mixture was treated with conc. HClaq for protonation, and then washed three times to remove residual salts and acid. The organic phase was separated and then concentrated in vacuo, redissolved in THF to form an approximately 20 wt % copolymer solution and then the copolymer was precipitated by adding the THF solution to hexane (20 fold excess). The copolymer was separated by filtration and dried in a vacuum oven at 80° C. for 16 hr. Approximately, 7.2 g (58%) of the Ring-opening polymer of MA/HxNB/NBC$_4$F$_9$ with BuOH was isolated (GPC Mw=3,700 Mn=2,400),

Example B5

ROMA Copolymer of MA/PENB with BuOH

An appropriately sized reaction vessel was loaded with NaOH (0.7 g, 18.5 mmol), BuOH (3.7 g, 50.7 mmol) and THF (20.0 g). The mixture was allowed to stir for 1 hr at 70° C. and then the polymer obtained in Example 5 (5.0 g) in 20.0 g of THF was added. After 3 hr of the reaction at 70° C., the mixture was cooled to room temperature. The reaction mixture was treated with conc. HClaq for protonation, and then washed three times to remove residual salts and acid, The organic phase was separated and then concentrated in vacuo, redissolved in THF to form an approximately 20 wt % copolymer solution and then the copolymer was precipitated by adding the THF solution to hexane (20 fold excess). The copolymer was separated by filtration and dried in a vacuum oven at 80° C. for 16 hr. Approximately, 4.7 g (75%) of the ring-opening polymer of MA/PENB with BuOH was isolated (GPC Mw=3,500 Mn=2,200).

Example B6

ROMA Copolymer of MA/PENB with BuOH

Maleic Anhydride (MA, 19.6 g, 200.0 mmol), Phenyl Ethyl Norbornene (PENB, 39.6 g, 200 mmol) and AIBN (3.3 g, 20.0 mmol) was dissolved in THF (36.2 g) and charged to an appropriately sized reaction vessel. The solution was sparged with nitrogen for 10 min to remove oxygen and then heated to 60° C. The mixture was allowed to stir at 60° C. for 23 hr, after which the solution was diluted to 20 wt % with 181.3 g of THF. The resulting solution was added to the suspension of NaOH (8.8 g, 220 mmol), BuOH (74.0 g, 1 mol) and THF (80.0 g) which were mixed at 70° C. for 1 hr. The mixture was allowed to stir for 2 hr at 70° C. and then was cooled to room temperature. The reaction mixture was treated with conc. HClaq for protonation, and then washed three times to remove residual salts and acid. The organic phase was separated and then concentrated in vacuo, redissolved in THF to form an approximately 20 wt % copolymer solution and then the copolymer was precipitated by adding the THF solution to hexane (20 fold excess). The copolymer was separated by filtration and dried in a vacuum oven at 80° C. for 16 hr. Approximately, 44.4 g (75%) of the ROMA copolymer of MA/PENB with BuOH was isolated (GPC Mw=7,700 Mn=4,000).

Example B7

ROMA Copolymer of MA/PENB with BuOH

Maleic Anhydride (MA, 19.6 g, 200.0 mmol), Phenyl Ethyl Norbornene (PENB, 39.6 g, 200 mmol) and AIBN (3.3 g, 20.0 mmol) was dissolved in EtOAc (36.2 g) and charged to an appropriately sized reaction vessel. The solution was sparged with nitrogen for 10 min to remove oxygen and then heated to 60° C. The mixture was allowed to stir at 60° C., for 20 hr. The reaction mixture was concentrated in vacuo and redissolved in THF (20 wt %). The resulting solution was added to the suspension of NaOH (8.80 g, 220 mmol), BuOH (74.12 g, 1 mol) and TI-IF (74.12 g) which were mixed at 70° C. for 1 hr. The mixture was allowed to stir for 2 hr at 70° C. and then was cooled to room temperature. The reaction mixture was treated with conc. HClacq for protonation, and then washed three times to remove residual salts and acid. The organic phase was separated and then concentrated in vacuo, redissolved in THF to form an approximately 20 wt % copolymer solution and then the copolymer was precipitated by adding the THF solution to hexane (20 fold excess). The copolymer was separated by filtration and dried in a vacuum oven at 80° C. for 16 hr. Approximately, 37.5 g (51%) of the ROMA copolymer of MA/PENB with BuOH was isolated (GPC Mw=9,900 Mn=5,400).

Example B8

ROMA Copolymer of MA/NB with tert-BuOH

An appropriately sized reaction vessel was loaded with NaOH (1.1 g, 28.5 mmol), t-BuOH (5.8 g, 77.8 mmol) and THF (20.0 g). The mixture was allowed to stir for 3 hr at 70° C. and then the polymer obtained with the same method in Example 1 (5.0 g) in 20.0 g of THF was added. After 16 hr of the reaction at 70° C., the mixture was cooled to room temperature. The reaction mixture was treated with conc. HClaq for protonation, and then washed three times to remove residual salts and acid. The organic phase was separated and then concentrated in vacuo, redissolved in THF to form an approximately 20 wt % copolymer solution and then the copolymer was precipitated by adding the THF solution to hexane (20 fold excess). The copolymer was separated by filtration and dried in a vacuum oven at 80° C. for 16 hr. Approximately, 4.5 g (65%) of the ring-opening polymer of MA/NB with t-BuOH was isolated (GPC Mw=3,000 Mn=1,500).

Example B9

ROMA Copolymer of MA/NB with 2-Methyl-2-Adamantanol

An appropriately sized reaction vessel was loaded with NaOH (1.1 g, 28.5 mmol), 2-Methyl-2-adamantanol (8.7 g, 52.0 mmol) and THF (40.0 g). The mixture was allowed to stir for 3 hr at 70 ° C. and then the polymer obtained in Example 1 (5.0 g) in 20.0 g of THF was added. After 16 hr of the reaction at 70° C., the mixture was cooled to room temperature. The reaction mixture was treated with conc. HClaq for protonation, and then washed three times to remove residual salts and acid. The organic phase was separated and then concentrated in vacuo, redissolved in THF to form an approximately 20 wt % copolymer solution and then the copolymer was precipitated by adding the THF solution to hexane (20 fold excess). The copolymer was separated by filtration and dried in a vacuum oven at 80° C. for 16 hr. Approximately, 5.31 g (57%) of the ring-opening polymer of MA/NB with 2-Methyl-2-adamantanol was isolated (GPC Mw=3,000 Mn=1,500).

Example B10

ROMA Copolymer of MA/NB with 2,2,3,3,4,4,4-heptafloro-1-butanol

An appropriately sized reaction vessel was loaded with NaOH (1.1 g, 28.5 mmol), 2,2,3,3,4,4,4-heptafluoro-1-butanol (7.8 g, 39.0 mmol) and THF (20.0 g). The mixture was allowed to stir for 3 hr at 70° C. and then the polymer obtained in Example 1 (5.0 g) in 20.0 g of THF was added. After 16 hr of the reaction at 70° C., the mixture was cooled to room temperature. The reaction mixture was treated with conc. HClaq for protonation, and then washed three times to remove residual salts and acid. The organic phase was separated and then concentrated in vacuo, redissolved in THF to form an approximately 20 wt % copolymer solution and then the copolymer was precipitated by adding the THF solution to hexane (20 fold excess). The copolymer was separated by filtration and dried in a vacuum oven at 80° C. for 16 hr. Approximately, 5.1 g (50%) of the ring-opening polymer of MA/NB with BuOH was isolated (GPC Mw=3,600 Mn=1,900).

Example B11

ROMA Copolymer of MA/NB with 4-tert-Butylcyclohexanol

An appropriately sized reaction vessel was loaded with NaOH (1.1 g, 28.5 mmol), 4-tert-Butylcyclohexanol (12.2 g, 78.1 mmol) and THF (20.0 g). The mixture was allowed to stir for 3 hr at 70° C. and then the polymer obtained in Example 1(5.0 g) in 20.0 g of THF was added. After 16 hr of the reaction at 70° C., the mixture was cooled to room temperature. The reaction mixture was treated with conc. HClaq for protonation, and then washed three times to remove residual salts and acid. The organic phase was separated and then concentrated in vacuo, redissolved in THF to form an approximately 20 wt % copolytner solution and then the copolymer was precipitated by adding the THF solution to hexane (20 fold excess). The copolymer was separated by filtration and dried in a vacuum oven at 80° C. for 16 hr. Approximately, 5.2 g (58%) of the ring-opening polymer of MA/NB with 4-tert-Butylcyclohexanol was isolated (GPC Mw=3,300 Mn=1,600).

Example B12

ROMA Copolymer of MA/NB with 4-tert-Butylphenol

An appropriately sized reaction vessel was loaded with NaOH (1.1 g, 28.5 mmol), 4-tert-Butylphenol (7.8 g, 52.0 mmol) and THF (15.0 g). The mixture was allowed to stir for 3 hr at 70° C. and then the polymer obtained in Example 1 (5.0 g) in 7.5 g of THF was added. After 16 hr of the reaction at 70° C., the mixture was cooled to room temperature. The reaction mixture was treated with conc. HClaq for protonation, and then washed three times to remove residual salts and acid. The organic phase was separated and then concentrated in vacuo, redissolved in THF to form an approximately 20 wt % copolymer solution and then the copolymer was precipitated by adding the THF solution to hexane (20 fold excess). The copolymer was separated by filtration and dried in a vacuum oven at 80° C. for 16 hr. Approximately, 5.4 g (61%) of the ring-opening polymer of MA/NB with 4-tert-Butylphenol was isolated (GPC Mw=3,400 Mn=1,800).

Example B13

ROMA Copolymer of MA/PENB with MeOH

Maleic Anhydride (MA, 14.7 g, 150 mmol), Phenyl Ethyl Norbornene (PENB, 29.7 g, 150 mmol) and AIBN (2.5 g, 15.0 mmol) was dissolved in THF (27.1 g) and charged to a reaction vessel. The solution was sparged with nitrogen for 10 min to remove oxygen and then heated to 60° C. The mixture was allowed to stir at 60° C. for 24 hr, after which the solution was diluted to 20 wt % with 148.04 g of THF. The resulting solution was added to the suspension of NaOH (6.6 g, 165 mmol), MeOH (24.0 g, 750 mmol) and THF (24.0 g) which were mixed at 70° C. for 1 hr. The mixture was allowed to stir for 3 hr at 70° C. and then was cooled to room temperature. The reaction mixture was treated with conc. HClaq for protonation, and then washed three times to remove residual salts and acid. The organic phase was separated and then concentrated in vacuo, redissolved in THE to form an approximately 20 wt % copolymer solution and then the copolymer was precipitated by adding the THF solution to hexane (20 fold excess). The copolymer was separated by filtration and dried in a vacuum oven at 80° C. for 16 hr. Approximately, 28.7 g (58%) of the Ring-opening polymer of MA/PENB with MeOH was isolated (GPC Mw=6,400 Mn=3,500).

Example B14

ROMA Copolymer of MA/PENB with MeOH

Maleic Anhydride (MA, 14.7 g, 150 mmol), Phenyl Ethyl Norbornene (PENB, 29.7 g, 150 mmol) and AIBN (2.5 g, 15.0 mmol) was dissolved in EtOAc (27.1 g) and charged to a reaction vessel. The solution was sparged with nitrogen for 10 min to remove oxygen and then heated to 60° C. The mixture was allowed to stir at 60° C. for 24 hr. The reaction mixture was concentrated in vacuo and redissolved in THF (20 wt %). The resulting solution was added to the suspension of NaOH (6.6 g, 165 mmol), MeOH (24.0 g, 750 mmol) and THF (24.0 g) which were mixed at 70° C. for 1 hr. The mixture was allowed to stir for 3 hr at 70° C. and then was cooled to room temperature. The reaction mixture was treated with conc. HClaq for protonation, and then washed three times to remove residual salts and acid. The organic phase was separated and then concentrated in vacuo, redissolved in THF to form an approximately 20 wt % copolymer solution and then the copolymer was precipitated by adding the THF solution to hexane (20 fold excess). The copolymer was separated by filtration and dried in a vacuum oven at 80° C. for 16 hr. Approximately, 30.4 g (61%) of the Ring-opening polymer of MA/PENB with MeOH was isolated (GPC Mw=9,700 Mn=5,300).

Example B15

(DRM) ROMA Copolymer of MA/NB with BuOH

Maleic Anhydride (MA, 98.1 g, 1.0 mol), 2-Norbornene (NB, 94.2 g, 1.0 mol) and AIBN (3.3 g, 20.0 mmol) were dissolved in THF (31.2 g) and toluene (93.6 g) and charged to an appropriately sized reaction vessel, The solution was sparged with nitrogen for 10 min to remove oxygen and then heated to 60° C. with stirring. After 3 hr, THF (64.1 g) was added and at 8 hr. AIBN (3.3 g, 20.0 mmol) and THF (39.4 g) were added and the mixture was allowed to stir at 60° C. for additional 16 hr. Then the reaction mixture was diluted to 20 wt % with THF and the resulting solution was added to a suspension of NaOH (44.1 g, 1.1 mol), BuOH (370.9 g, 5.0 mol) and mixed at 65° C., for 3 hr. The mixture was then cooled to 40° C., treated with conc. HClaq (126.2 g, 1.2 mol) for protonation, and then washed with toluene (384 g) and water (961 g) (1×), and THF (192 g) and water (961 g) (3×) to remove inorganic residues. The organic phase was then separated and washed with first a MeOH/water/hexane mixture (1×) and then a MeOH/toluene/hexane mixture (2×) to extract any residual monomer. After the extraction, BuOH (74.18 g, 1.0 mol) and PGMEA (611 g) was added to the reaction mixture and evaporated until residual MeOH was less than 1%. Then the reaction mixture was heated up to 130° C. for dissolution rate modification. Samples were taken to monitor the dissolution rate of the copolymer. The reaction mixture was cooled and solvent exchanged into PGMEA when the desired dissolution rate was achieved, 651.4 g of the polymer as a 20 wt % solution was obtained (GPC Mw =13,600 Mn=6,800).

Figure 2A:
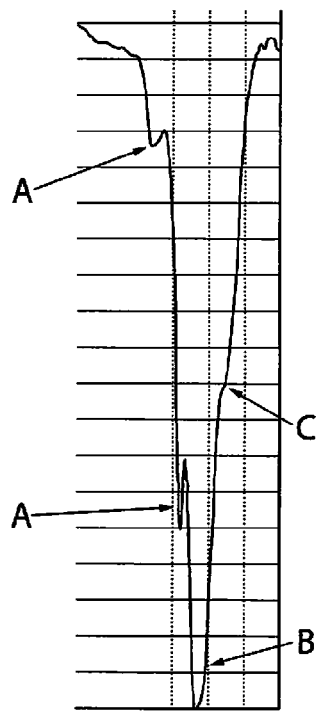
FIGS. 2a, 2b, 2c and 2d are portions of Infrared spectra that show before and after carbonyl stretching frequencies for copolymers subjected to dissolution rate modification process embodiments in accordance with the present invention.
Figure 2B:
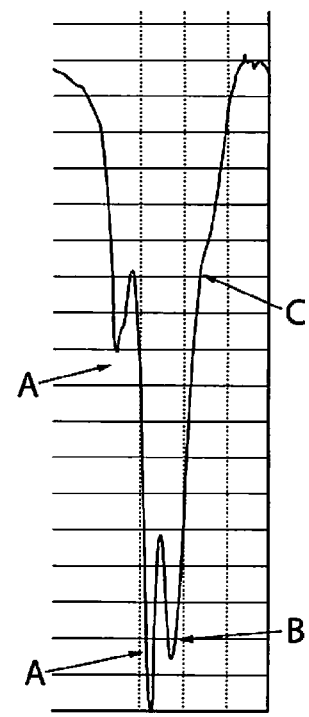

While the above procedure includes a dissolution rate modification step, it should be appreciated that such a processes can be accomplished both in an alcohol-free and an alcohol-added environment. To that effect a 20 wt % polymer solution of ROMA NB/MA-BuOH in PGMEA was heated at 125° C. for 3 hours. Infrared spectra, taken with a Nicolet Avatar320 FT-IR spectrometer, of an initial sample and one taken after 3 hours of heating were obtained and portions thereof are provided in FIGS. 2a and 2b, respectively. In addition, another 20 wt % polymer solution of a different ROMA NB/MA-BuOH in PGMEA was heated at 125° C. for 3 hours in the presence of BuOH. Infrared spectra, taken with a Nicolet Avatar320 FT-IR spectrometer, of an initial sample and one taken after 3 hours of heating were obtained and portions thereof are provided in FIGS. 2c and 2d, respectively, Turning first to FIGS. 2a and 2b, it can be seen that the two peaks 'A' that represent the carbonyl stretching frequencies of a MA ring structure increase significantly between the spectra of the initial sample (FIG. 2a) and the sample after 3 hours of heating (FIG. 2b), In addition, Peak 'B' which represents the carbonyl stretching frequency of the butyl ester carbonyl and Shoulder 'C' are seen to decrease in intensity between the two spectra. Thus it is believed that these spectra indicated that heating a copolymer with a BuOH ring-opened maleic anhydride-type repeating unit in the absence of any added alcohol results in some portion of those repeating units closing and that such ring closure reduces the amount of carboxylic acid available to provide solubility of the polymer in an aqueous base.

Figure 2C:
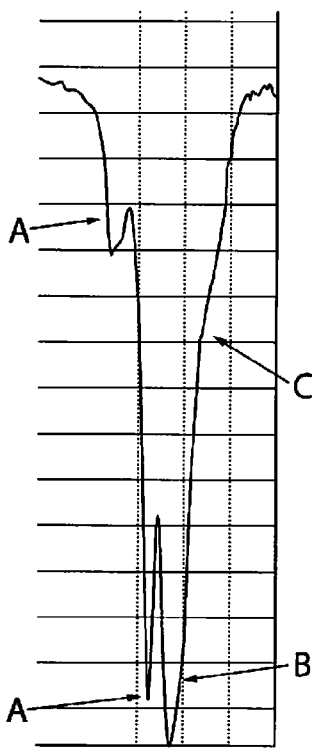
Figure 2D:
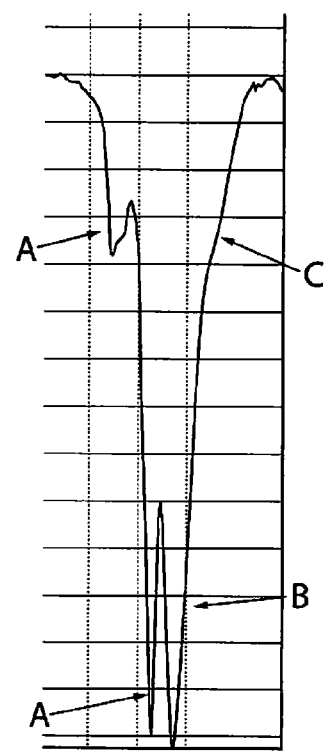

Referring now to FIGS. 2c and 2d, it can be seen that the two peaks 'A' that represent the carbonyl stretching frequencies of a MA ring structure increase only slightly between the spectra of the initial sample (FIG. 2c) and the sample after 3 hours of heating (FIG. 2d). In addition, Peak 'B' which represents the carbonyl stretching frequency of the butyl ester carbonyl remains essentially constant while Shoulder 'C' is seen to decrease in intensity between the two spectra. Thus it is believed that these spectra indicated that heating a copolymer with a BuOH ring-opened maleic anhydride-type repeating unit in the presence of added alcohol results in some portion of those repeating units closing and other portions of those repeating units becoming the diester. Since both ring closure and diester formation reduce the amount of carboxylic acid available to provide solubility of the polymer in an aqueous base, the dissolution rate of such initial copolymer is reduced.

Figure 3:
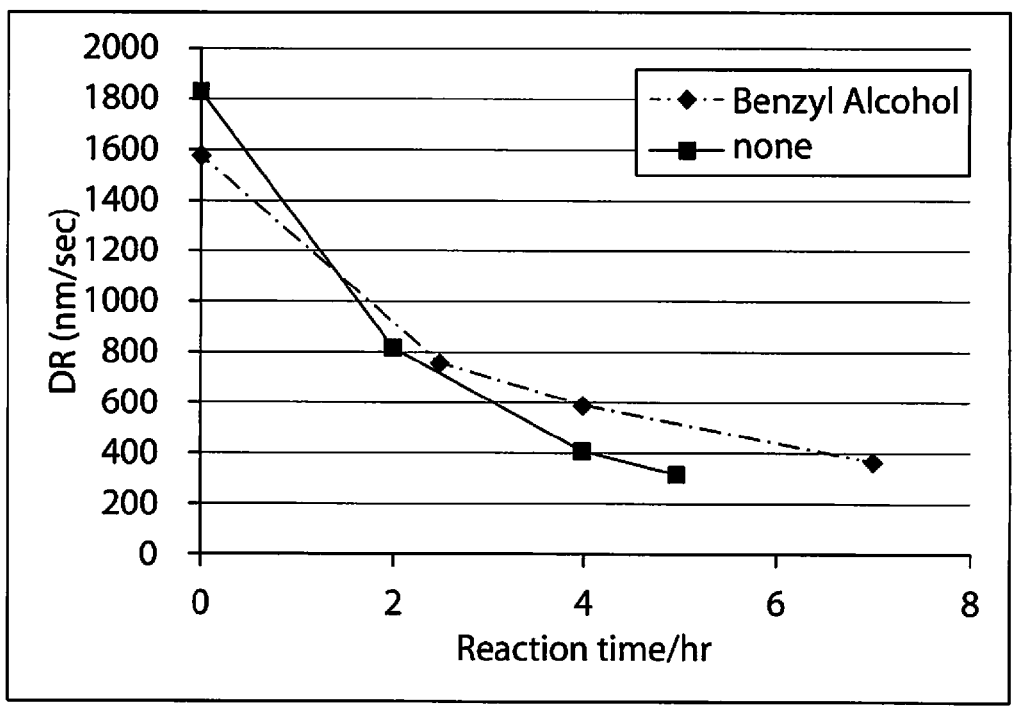
FIG. 3 is a graphical representation in the change in dissolution rate versus reaction time for a ROMA copolymer subjected to dissolution rate modification process embodiments in accordance with the present invention.

Referring now to FIG. 3, it graphically represents a dissolution rate modification step results in a lowering of the dissolution rate of the original ROMA copolymer with or without the addition of an alcohol moiety, for example benzyl alcohol. Thus it is believed that the results shown in FIG. 3 further indicate that such a step must reduce the availability of carboxylic moieties that had previously been present by either or both of ring-closure or diesterification.

Alkali Dissolution Rate

The polymers from each of Examples B1-B12 and B15 were dissolved in PGMEA to form a 25 wt % polymer solution. Each solution was spun onto a 3 inch silicon wafer and soft baked at 110° C. for 100 seconds to give polymer films having a thickness of about 3 um, The wafers were developed by immersing them in a 0.4% TMAH developer solution. A dissolution rate of each film (shown below) was determined by measuring the time to visually clear the polymer film.

| | Ex. # | | | | | | |
|---|---|---|---|---|---|---|---|
| | B1 | B2 | B3 | B4 | B5 | B6 | B7 |
| DR (nm/sec) | 162 | 95 | 96 | 84 | 83 | 47 | 32 |

| | Ex. # | | | | | |
|---|---|---|---|---|---|---|
| | B8 | B9 | B10 | B11 | B12 | B15 |
| DR (nm/sec) | 164 | 176 | 149 | 179 | 71 | 47 |

Transparency of Copolymers

The solutions of the polymer B1-B15 were applied onto glass wafers as described above to give 3 um thick layer. Transparency at 400 nm was measured before and after thermal treatment in air at 250° C./30 min. Pre-treatment, each of the films were at least 98% transparent, while after the thermal treatment the polymers of Examples B2, B3 and B4, all polymers with an alkylNB repeating unit, were significantly lowered. B2 and B4 to 37% and 40%, respectively and B3 to 78%. With regard to the others, only Examples B13 and B14 showed as much as a 10% lowering in % transparency.

Tg

Tg of the polymers were measured by modulated DSC. The measurement condition is 10° C./min under $N_2$ flow. The copolymers of Examples B1-B6, B11 and B12 each demonstrated a Tg of 150° C. +/−10° C. while Examples B8-B10 demonstrated Tg of 183°C., 186° C. and 177° C., respectively.

Copolymer Composition Examples a: Dielectric Constant

The dielectric constant of a film prepared from a copolymer composition of each of the copolymers of B1-B15 was measured at 1 KHz, 10 KHz, 100 KHz and 1 MHz following the technique of JIS-K6911, a Japanese Industrial Standard. The methods of preparing each composition are provided in Examples C1a-C15a. The film thickness of each film, needed to calculate the dielectric constant, was measured by using Dainippon Screen MFG CO., LTD. Lambda ace VM-1020.

Example C1a

The polymer from Example B1 was dissolved in PGMEA/ EL (4/3, 16 wt %) along with TrisP 3M6C-2-201 (25% on the polymer, from Toyo Gosei) and with TMPTGE (20% on the polymer). The formulation was spun onto an aluminum plate (200 um thickness, 100 mm ×100 mm) at 300 rpm for 23 sec, soft baked at 110° C. for 100 sec to give a polymer film of about 3 microns, then exposed at 500 mJ/cm2 using a mask aligner having a broad band Hg vapor light source (g, h and i bands). After exposure, the wafer was post-exposure baked at 220° C., for 60 min under nitrogen atmosphere to obtain a cured film.

Example C2a

The process of C1a was repeated except that the polymer from Example B2 was dissolved in PGMEA (25 wt %) along with TrisP 3M6C-2-201 (25% on the polymer) and with TMPTGE (20% on the polymer) and the spinning condition was 300 rpm for 3 sec followed by 400 rpm for 20 sec.

Example C3a

The process of C1a was repeated except that the polymer from Example B3 was dissolved in PGMEA (25 wt %) along with TrisP 3M6C-2-201 (25% on the polymer) and with TMPTGE (20wt % on the polymer) and the spinning condition was 300 rpm for 3 sec followed by 900 rpm for 20 sec.

Example C4a

The process of C1a was repeated except that the polymer from Example B4 was dissolved in PGMEA (25 wt %) along with TrisP 3M6C-2-201 (25% on the polymer) and with TMPTGE (20wt % on the polymer) and the spinning condition was 300rpm for 3 sec followed by 700 rpm for 20 sec.

Example C5a

The process of C1a was repeated except that the polymer from Example B5 was dissolved in PGMEA (25 wt %) along with TrisP 3M6C-2-201 (25% on the polymer) and with VG3101L (20 wt % on the polymer) and the spinning condition was 300 rpm for 3 sec followed by 800 rpm for 20 sec.

Example C6a

The process of C1a was repeated except that the polymer from Example B6 was dissolved in PGMEA (25 wt %) along with TrisP 3M6C-2-201 (25% on the polymer) and with VG3101L (20wt % on the polymer) and the spinning condition was 300 rpm for 3 sec and 1300 rpm for 20 sec.

Example C7a

The process of C1a was repeated except that the polymer from Example B7 was dissolved in PGMEA (25 wt %) along with TrisP 3M6C-2-201 (25% on the polymer) and with VG3101L, (20 wt % on the polymer) and the spinning condition was 300 rpm for 3 sec followed by 1370 rpm for 20 sec.

Example C8a

The process of C1a was repeated except that the polymer from Example B8 was dissolved in PGMEA (25 wt %) along with TrisP PAC (25% on the polymer) and with TMPTGE (20% on the polymer) and the spinning condition was 300 rpm for 3 sec followed by 2000 rpm for 20 sec.

Example C9a

The process of C1a was repeated except that the polymer from Example B9 was dissolved in PGMEA/MAK=3/1 (20 wt %) along with TrisP 3M6C-2-201 (25% on the polymer) and with TMPTGE (20% on the polymer) and the spinning condition was 300 rpm for 3 sec followed by 1500 rpm for 20 sec.

Example C10a

The process of C1a was repeated except that the polymer from Example B10 was dissolved in PGMEA (25 wt %) along with TrisP 3M6C-2-201 (25% on the polymer) and with TMPTGE (20% on the polymer) and the spinning condition was 300 rpm for 3 sec followed by 1000 rpm for 20 sec.

Example C11a

The process of C1a was repeated except that the polymer from Example B10 was dissolved in PGMEA (25 wt %) along with TrisP 3M6C-2-201 (25% on the polymer) and with TMPTGE (20% on the polymer) and the spinning condition was 300 rpm for 3 sec followed by 1500 rpm for 20 sec.

Example C12a

The process of C1a was repeated except that the polymer from Example B10 was dissolved in PGMEA (25 wt %) along with TrisP 3M6C-2-201 (25% on the polymer) and with TMPTGE (20% on the polymer) and the spinning condition was 300 rpm for 3 sec followed by 930 rpm for 20 sec.

Example C13a

The process of C1a was repeated except that the polymer from Example B13 was dissolved in PGMEA (25 wt %) along with Tris-P PAC (25% on the polymer) and with TMPTGE (20% on the polymer) and the spinning condition was 300 rpm for 3 sec followed by 1520 rpm for 20 sec.

Example C14a

The process of C1a was repeated except that the polymer from Example B14 was dissolved in PGMEA (25 wt %) along with Tris-P PAC (25% on the polymer) and with TMPTGE (20% on the polymer) and the spinning condition was 300 rpm for 3 sec followed by 1980 rpm for 20 sec.

Example C15a

The process of C1a was repeated except that the polymer solution from Example B15 along with Tris-P PAC (25% on the polymer) and with VG3101L (20% on the polymer) and the spinning condition was 300 rpm for 3 sec followed by 830 rpm for 20 sec.

The dielectric constants of all of the films, other than the films of Examples C9a and C12a, were uniformly low at all frequencies, ranging from a low value of 2.9 to 3.1 at 1 MHz and from a low of 3.1 to 3.4 at 1 KHz. While the results for C9a and C12a were higher, they also exhibited desirable low dielectric constant values ranging from 3.3 at 1 MHz to 3.7 at 1 KHz.

b: Transparency of Cured Film

The copolymer compositions as prepared for each of Examples C1a, C3a, C4a, C6a and C13a-C15a were used to prepare films about 3 um thick on glass plates. After a soft bake at 110° C. for 100 sec., each film was exposed at 500 mJ/cm2 using a mask aligner having a broad band Hg vapor light source (g, h and i bands). After exposure, the wafer was post-exposure baked at 220° C. for 60 min under nitrogen atmosphere to obtain a cured film. The glass plate coated with the film was heated at 250° C. for 30 minutes in an oven under air, and the transparency of the film at 400 nm wavelength was measured by using ultraviolet-visible spectroscope (Hitachi U-2000). The resulting heat treated films were labeled Examples C1b, C3b, C4b, C6b and C13b-C15b, and the % transparency of each is provided below.

| | Ex. # | | | | | | |
|---|---|---|---|---|---|---|---|
| | C1b | C3b | C4b | C6b | C13b | C14b | C15b |
| % Transp. | 76 | 77 | 66 | 95 | 82 | 82 | 77 | c: 5% Weight Loss Temperature

The copolymer compositions as prepared for each of Examples C1a-C4a, C6a, C7a, and C12a-C15a were used to prepare and expose films about 3 um thick on four inch thermal oxide coated silicon wafers. After each film was cured, a portion of the film was removed from the wafer and 5% weight loss temperature was measured by TGDTA. The measurement condition was 10 c/min under $N_2$ flow. The resulting weight loss measurements were labeled Examples C1c-C4c, C6c, C7c, and C12c-C15c, and are provided below.

As seen, each of the films demonstrates a 5% weight loss temperature in excess of 300° C. and can be considered thermally stable at temperatures up to and including 300° C.

| | Ex. # | | | | |
|---|---|---|---|---|---|
| | C1c | C2c | C3c | C4c | C6c |
| Temp. ° C. | 316 | 324 | 329 | 329 | 343 |

| | Ex. # | | | | |
|---|---|---|---|---|---|
| | C7c | C12c | C13c | C14c | C15c |
| Temp. ° C. | 339 | 326 | 341 | 320 | 330 | d: Litho Evaluation

The copolymer compositions as prepared for each of Examples C1a-C15a were used to prepare films about 3 um thick on glass plates. After a soft bake at 110° C. for 100 sec., each film was exposed at 500 mJ/cm² through a chrome on glass mask using a mask aligner having a broad band Hg vapor light source (g, h and i bands). After exposure, each wafer was immersion developed using 0.4% TMAHaq for 10 sec, washed with deionized water, then spun dry at 2000 rpm for 20 sec. The final thickness of the polymer remaining of each wafer was measured as was the resolution of 10 um lines and spaces. The results of these evaluations, as well as the initial film thickness for each wafer, labeled as Examples C1d-C15d, are provided below.

| | Ex. # | | | | |
|---|---|---|---|---|---|
| | C1d | C2d | C3d | C4d | C5d |
| Initial Thickness (um) | 2.9 | 2.8 | 3.2 | 2.4 | 3.0 |
| Final Thickness (um) | <0.25 | 1.6 | 0.5 | 1.8 | 2.0 |
| % FT Loss | >90 | 41 | 83 | 26 | 32 |
| Visual Resolution | | | | Good | Good |

| | Ex. # | | | | |
|---|---|---|---|---|---|
| | C6d | C7d | C8d | C9d | C10d |
| Initial Thickness (um) | 3.0 | 3.0 | 3.0 | 2.4 | 3.0 |
| Final Thickness (um) | 3.0 | 3.1 | 0 | 0.4 | 0 |
| % FT Loss | 0 | 0 | 100 | 84 | 100 |
| Visual Resolution | Good | Residue | | | |

| | Ex. # | | | | |
|---|---|---|---|---|---|
| | C11d | C12d | C13d | C14d | C15d |
| Initial Thickness (um) | 3.0 | 3.0 | 3.0 | 3.0 | 2.9 |
| Final Thickness (um) | 0 | 1.4 | 2.4 | 2.9 | 2.6 |
| % FT Loss | 100 | 53 | 17 | 1 | 9 |
| Visual Resolution | | Good | Good | Good | Good |

Figure 4A:
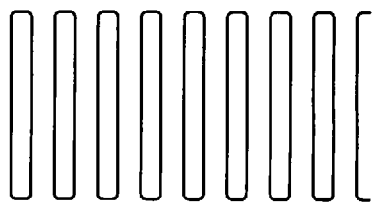
FIGS. 4a and 4b are photomicrographs of 10 um and 5 um lines and spaces obtained after an image-wise exposure of a film formed from a (DRM) ROMA copolymer film embodiment in accordance with the present invention.
Figure 4B:
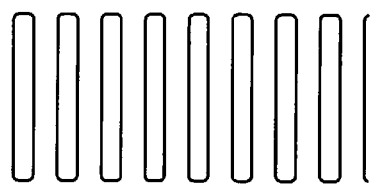

Referring now to FIGS. 4a and 4b, photomicrographs of portions of images formed for Example C15d are shown. In FIG. 4a, 10 um lines and spaces are seen to be cleanly resolved, while in FIG. 4b, 5 um lines and spaces are also seen to be well resolved.

Thermal Flow Resistance

Example C5e

The heat resistance was measured by cutting the wafer patterned in Example C5d into several pieces, heating the pieces to 220° C. for 60 minutes in an oven under $N_2$, and then observing a SEM cross-section of the heated piece. After 220° C. thermal cure, pattern flow was observed.

Example C6e

The heat resistance was measured by cutting the wafer patterned in Example C6d into several pieces, heating the pieces to 220° C. for 60 minutes in a $N_2$ oven, then observing a SEM cross-section of each heated piece. There is no pattern flow after thermal cure thus indicating that the cured polymer film exhibits heat resistance and stability to at least 220° C.

Example C7e

The heat resistance was measured by cutting the wafer patterned in Example C7d into several pieces, heating the pieces to 220° C. for 60 minutes in a $N_2$ oven, then observing a SEM cross-section of each heated piece. There is no pattern flow after thermal cure thus indicating that the cured polymer film exhibits heat resistance and stability to at least 220° C.

Example C13e

The heat resistance was measured by cutting the wafer coated with the film into several pieces, heating the pieces to 220° C. for 60 minutes in a $N_2$ oven, then observing a SEM cross-section of each heated piece. There is no pattern flow after thermal cure thus indicating that the cured polymer film exhibits heat resistance and stability to at least 220° C.

Example C14e

The heat resistance was measured by cutting the wafer coated with the film into several pieces, heating the pieces to 220° C. for 60 minutes in a $N_2$ oven, then observing a SEM cross-section of each heated piece. There is no pattern flow after thermal cure thus indicating that the cured polymer film exhibits heat resistance and stability to at least 220° C.

g: NMP Tolerance

Example C6g

The formulation in Example C6a was spun onto 3 inch thermal oxide silicon wafer at 300 rpm for 3 sec followed by 1300 rpm for 20 sec, soft baked at 110° C. for 100 sec to give a polymer film of about 2.3 microns, then exposed at 500 mJ/cm2 using a mask aligner having a broad band Hg vapor light source (g, h and i bands). After exposure, the wafer was post-exposure baked at 220° C. for 60 min under nitrogen atmosphere to obtain a cured film. The wafer was soaked into NMP at 40° C. for 10 min, and then measured film thickness. The film thickness remained 2.3 um and peeling was not observed.

Example C15g

The formulation in Example C15a was spun onto 3 inch thermal oxide silicon wafer at 300 rpm for 3 sec followed by 1300 rpm for 20 sec, soft baked at 110° C. for 100 sec to give a polymer film of about 2.46 microns, then exposed at 500 mJ/cm2 using a mask aligner having a broad band Hg vapor light source (g, h and i bands). After exposure, the wafer was post-exposure baked at 220° C. for 60 min under nitrogen atmosphere to obtain a cured film. The wafer was soaked into NMP at 23° C. for 60 min, and then measured film thickness. The film thickness remained 2.56 um (4% gain) and neither crack nor peeling was observed.

It will be understood that the data provided herein above demonstrate that the copolymer embodiments in accordance with the present invention, as well the composition embodiments that encompass such copolymers are useful for forming self-imageable, thermally stable, highly transparent low-K, dielectric layers. More specifically, such copolymers and layers made therefrom are readily applied to a substrate using well known microelectronic and/or optoelectronic processing, have dielectric constants at or below 3.9 and exhibit thermal stability to temperatures in excess of 300° C.

It will further be understood that while examples of methods for making the copolymer embodiments in accordance with the present invention have been provided, such methods are not limiting. That is to say that other reaction times, temperatures, solvents and the like can be used to adjust and control characteristics of the copolymers, copolymer compositions and films, layers or structures made therefrom. For example, where a polymerization example discloses the use of AIBN as a polymerization initiator, other such initiators such as the exemplary initiators listed herein above can also be employed and can provide copolymers having different molecular weights than those disclosed in any specific example. It will be understood that such a modification is within the scope of the embodiments of the present invention. Similarly other casting and polymerization solvents can be employed and where such other solvents are used to make the copolymer, composition and film or layer embodiments described herein, such other solvents are also within the scope of the present invention.

What is claimed is:

1. A layer forming polymer composition, comprising:
    a self-imageable polymer including norbornene-type repeating units and maleic anhydride-type repeating units, where:
    such norbornene-type repeating units are represented by Formula Ia, which are derived from norbornene-type monomers represented by Formula I:

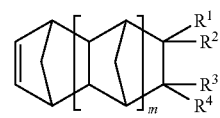

I

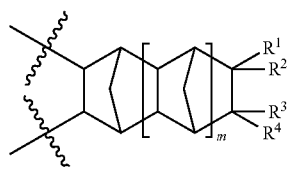

Ia where m is 0, 1 or 2, each $R^1$, $R^2$, $R^3$ and $R^4$ for the said norbornene-type repeating unit is independently a hydrogen or a hydrocarbyl pendent group;

such maleic anhydride-type of repeating units are represented by one or more of Formulae IIIa and IIIb, which are derived from maleic anhydride monomers represented by Formula III:

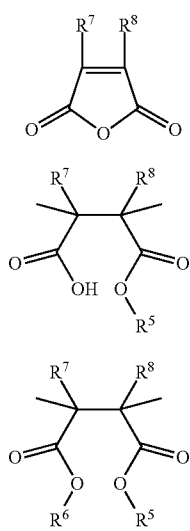

where $R^5$ and $R^6$ are each independently one of hydrogen, methyl, ethyl, a fluorinated or perfluorinated methyl or ethyl, a linear or branched $C_3$-$C_9$ hydrocarbyl group, a linear or branched fluorinated or perfluorinated $C_3$-$C_9$ hydrocarbyl group or a $C_6$-$C_{18}$ substituted or unsubstituted cyclic or polycyclic hydrocarbyl group; $R^7$ and $R^8$ are the same or different and are selected from hydrogen, methyl and ethyl;

a photo active compound;

an epoxy resin comprising at least two epoxy groups; and a solvent.

2. The layer forming polymer composition of claim 1, wherein $R^7$ and $R^8$ are hydrogen.

3. The polymer composition of claim 1, where $R^5$ is one of methyl, ethyl, propyl, isopropyl, butyl, isobutyl, sec-butyl or tert-butyl.

4. The polymer composition of claim 1, where the epoxy resin comprises three epoxy groups.

5. The polymer composition of claim 1 or 2, where the photo active compound is selected from:

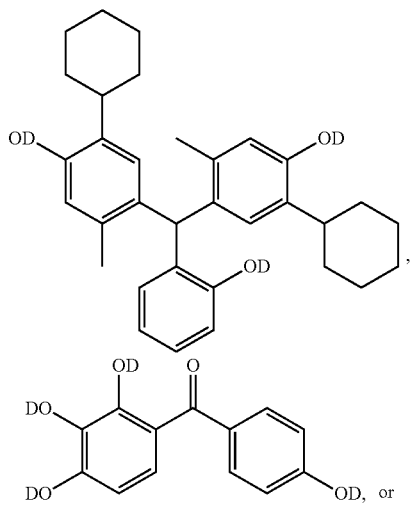

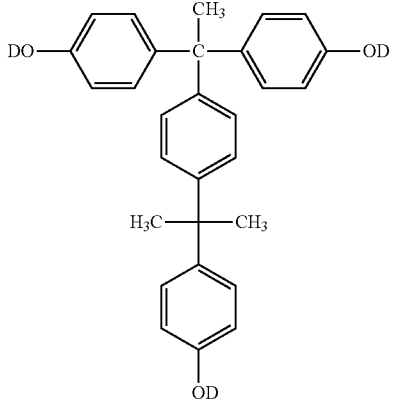

wherein at least one of D is:

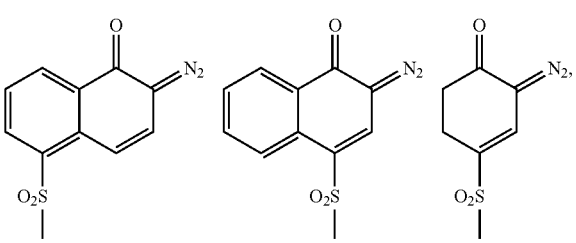

and remaining D is hydrogen.

6. The polymer composition of claim 5 where the solvent is propylene glycol monomethyl ether acetate, ethyl lactate, methyl n-amyl ketone or mixtures thereof.

7. The polymer composition of claim 5, where $R^1$-$R^4$ are each hydrogen, $R^5$ is butyl and the epoxy resin is

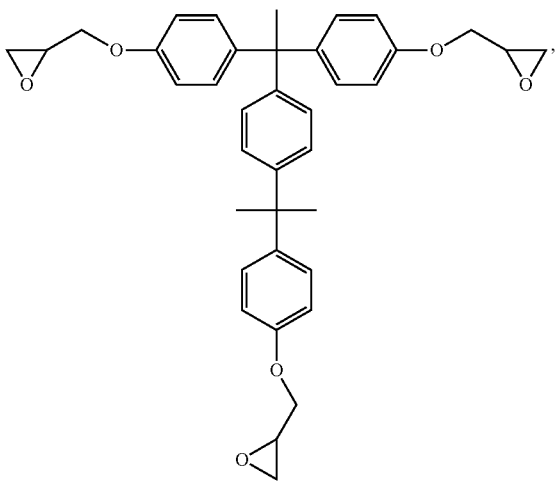 [SMILES: CC(C)(c1ccc(OCC2CO2)cc1)c1ccc(C(C)(c2ccc(OCC3CO3)cc2)c2ccc(OCC3CO3)cc2)cc1]

trimethylolpropane triglycidylether or bisphenol A epoxy resin.

8. The polymer composition of claim 6, where the photo active compound is

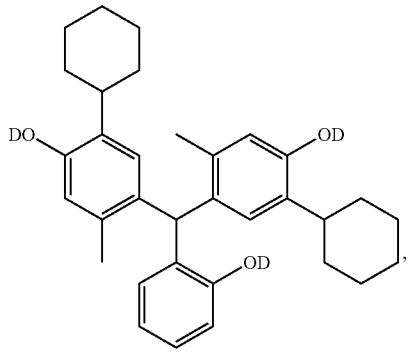

wherein at least one of D is:

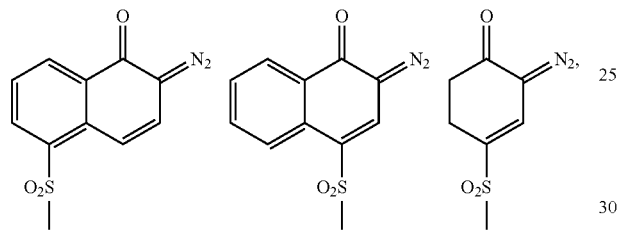

and remaining D is hydrogen, the epoxy resin is

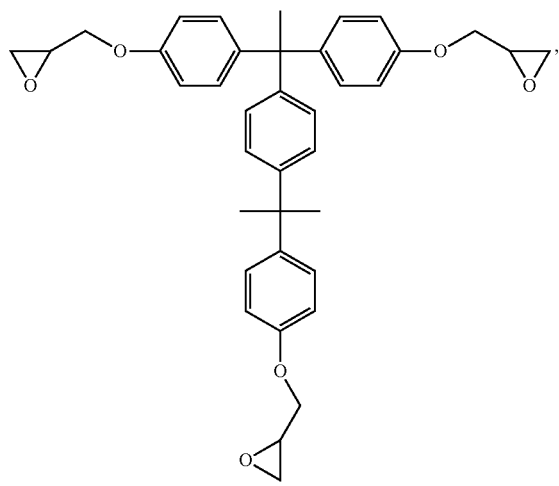 [SMILES: CC(C)(c1ccc(OCC2CO2)cc1)c1ccc(C(C)(c2ccc(OCC3CO3)cc2)c2ccc(OCC3CO3)cc2)cc1]

and the solvent is propylene glycol monomethyl ether acetate.

9. A polymer layer formed from the polymer composition of claim 1 having a dielectric constant of 3.2 or less at 1MHz.

10. A polymer layer formed from the polymer composition of claim 1 having a transparency at 400 nm of more than 85% after curing at 250° C. for 30 minutes.

11. The polymer composition of claim 1, wherein the polymer further comprises maleic anhydride-type repeating units represented by Formula IIIc:

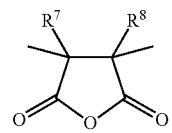

where $R^7$ and $R^8$ are the same or different and are selected from hydrogen, methyl and ethyl.

12. A layer forming polymer composition, comprising:

a self-imageable polymer consisting of norbornene-type repeating units and maleic anhydride-type repeating units, where:

such norbornene-type repeating units are represented by Formula Ia, which are derived from norbornene-type monomers represented by Formula I:

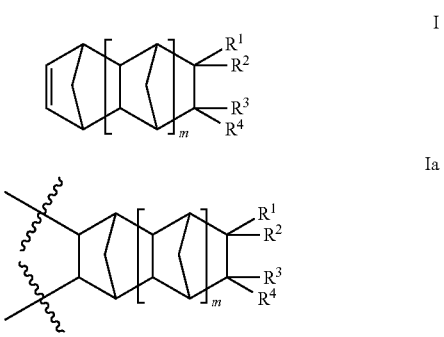

where m is 0, 1 or 2, each $R^1$, $R^2$, $R^3$ and $R^4$ for the said norbornene-type repeating unit is independently a hydrogen or a hydrocarbyl pendent group selected from $C_1$ to $C_{30}$ aryl, aralkyl or alkaryl groups or a perfluorinated alkyl group or a perfluorinated aryl group;

such maleic anhydride-type of repeating units include one or more repeating units of Formulae IIa and IIb, and optionally include repeating units of Formula IIc which are derived from maleic anhydride monomers represented by Formula II:

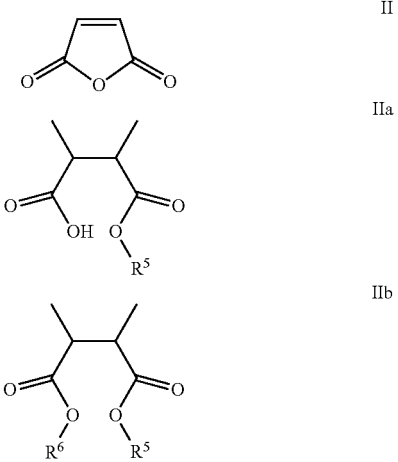

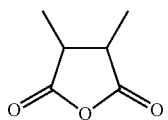

where $R^5$ and $R^6$ are each independently one of hydrogen, methyl, ethyl, a fluorinated or perfluorinated methyl or ethyl, a linear or branched $C_3$-$C_9$ hydrocarbyl group; a linear or branched fluorinated or perfluorinated $C_3$-$C_9$ hydrocarbyl group; a $C_6$-$C_{18}$ substituted or unsubstituted cyclic or polycyclic hydrocarbyl group;

a photo active compound;

an epoxy resin comprising at least two epoxy groups; and a solvent.

* * * * *